(12) United States Patent
Patrick et al.

(10) Patent No.: US 8,107,141 B2
(45) Date of Patent: Jan. 31, 2012

(54) PRINT PRESENTATION

(75) Inventors: Lachlan James Patrick, Epping (AU); Julie Rae Kowald, Dundas Valley (AU); Colin Eric Druitt, Marsfield (AU); Timothy Mark Morris-Yates, Willoughby (AU); Andrew James Lo, Balmain (AU); Christopher Mark Paola, Hornsby (AU); Kevin Mun Choong Tham, Pyrmont (AU); James Robert Metcalfe, Killara (AU); Michael Jan Lawther, Eastwood (AU); John Anthony Brett, Kangaroo Point (AU)

(73) Assignee: Canon Information Systems Research Australia Pty. Ltd., North Ryde, New South Wales (AU)

( * ) Notice: Subject to any disclaimer, the term of this patent is extended or adjusted under 35 U.S.C. 154(b) by 778 days.

(21) Appl. No.: 11/682,551

(22) Filed: Mar. 6, 2007

(65) Prior Publication Data

US 2007/0211269 A1 Sep. 13, 2007

(30) Foreign Application Priority Data

Mar. 7, 2006 (AU) ................................ 2006200969

(51) Int. Cl.
*G03F 3/10* (2006.01)
*H04N 1/46* (2006.01)
*G06T 15/00* (2011.01)
*G09G 5/00* (2006.01)

(52) U.S. Cl. ........ 358/527; 358/537; 358/540; 345/419; 345/584

(58) Field of Classification Search ........................ None
See application file for complete search history.

(56) References Cited

U.S. PATENT DOCUMENTS 5,977,978 A * 11/1999 Carey et al. .................... 345/419
2006/0109277 A1* 5/2006 Fenney et al. ................. 345/584

OTHER PUBLICATIONS

Adobe Photoshop 5.0 User Guide (c) 1998 Adobe Systems Incorporated pp. 1, 2, 41, 46-48, 55-57, 67, 106, 111, 124-126, 172, 187-189, 244-255, 284-287, 347-348.*
Adobe Photoshop 5.0 User Guide (c) 1998 Adobe Systems Incorporated pp. 224-236 & 240.*
Adobe Photoshop 5.0 User Guide (c) 1998 Adobe Systems Incorporated pp. 1, 6, 79, 96, 97, 109, 110.*
Daniele Marini et al Postfiltering for color appearance in synthetic image visualization Journal of Electronic Imaging 13(1), p. 111-119 (Jan. 2004).*
Pixar The RenderMan Interface Version 3.2.1 Nov. 2005, copyright 2005 pp. 2, 3, 86, 109, 110, 154.*

* cited by examiner

*Primary Examiner* — Twyler Haskins
*Assistant Examiner* — Barbara Reinier
(74) *Attorney, Agent, or Firm* — Fitzpatrick, Cella, Harper & Scinto

(57) ABSTRACT

A method of providing a print representation of a document which, when printed, has at least one region the appearance of which is dependent on viewing conditions. The method comprises generating a representation of the document and then modifying the appearance of the at least one region to thereby simulate the appearance of the document when printed. This is achieved by animating the representation of the at least one region or at least partially combining the at least one region with an image.

28 Claims, 18 Drawing Sheets

PRINT PRESENTATION

FIELD OF THE INVENTION

The present invention relates to a method and apparatus for providing a print representation and in particular to providing a print representation of a document which, when printed, has at least one region the appearance of which is dependent on viewing conditions.

DESCRIPTION OF THE BACKGROUND ART

The reference to any prior art in this specification is not, and should not be taken as, an acknowledgment or any form of suggestion that the prior art forms part of the common general knowledge.

The Print Preview is a common technique for proofing a document before creating a physical printout. The Print Preview can be used to find errors that would have occurred in the physical printed document. By fixing such errors before creating the printout, it is possible to save money, time and resources by reducing or avoiding the need for physical proofs.

Many printers use a set of primary colours, typically Cyan, Magenta, Yellow and Black, (CMYK printing) which are combined on the page in various quantities to produce a range of colours, the full range of which is called the printer's gamut.

A problem occurs, however, when computer displays are not capable of displaying all the colours and properties that physical printers can produce. Even a calibrated display may not be able to accurately represent the full gamut available to a physical printout.

To overcome this problem, an existing solution is to choose colours for the display that are as similar as possible to the printed colours. In many cases, this is sufficient. In other cases, modern displays have a sufficiently wide gamut that the printer's gamut is fully displayable, providing such displays are colour calibrated.

This problem is exacerbated when special colours, called characteristic or spot colours, are added to a printer to (amongst other things) further improve the printer's gamut, or simply to print particular colours accurately or at low cost, for example, frequently printed company logos. Such spot colours are typically difficult to render using a normal display.

If a calibrated display can accurately represent such a substance using a flat colour, doing so may conceal where that substance is to be printed, since it appears similar to any other normal process colour. This can be overcome, for example by outlining the spot colour location, to indicate where the spot colour will be printed.

However, this problem is exacerbated when a spot colour substance has unusual properties, such as when the appearance is dependent on the physical surroundings where the printed material is viewed. This can occur if the colour depends on viewing angle, the colour fluoresces under ultraviolet light, varies with temperature, or is reflective. For example, a golden metallic substance may both reflect some of the colours and shapes of surrounding objects or lights, while simultaneously imparting a yellowish tint to that reflection.

In this situation, even highlighting or outlining the region, or even replacing the spot colour with an alternative flat colour does not mimic the colour properties, and hence the appearance of the physical printout. Consequently, current techniques do not allow accurate preview of the printing of such documents and it therefore remains impossible to make fully informed decisions about the nature of the physical printout, without actually printing it.

SUMMARY OF THE PRESENT INVENTION

It is an object of the present invention to substantially overcome, or at least ameliorate, one or more disadvantages of existing arrangements.

In a first broad form the present invention provides a method of providing a print representation of a document which, when printed, has at least one region the appearance of which is dependent on viewing conditions, the method comprising, in a processing system:
   a) generating a representation of the document; and,
   b) modifying the appearance of the at least one region to thereby simulate the appearance of the document when printed by at least one of:
      i) animating the representation of the at least one region; and,
      ii) at least partially combining the at least one region with an image.

Typically the at least one region is to be printed using a spot colour.

Typically the spot colour is formed from at least one of inks, dyes, toners, paints, films, lacquers and other printing substances having a reflective metallic appearance.

Typically the method comprises, in the processing system, animating the representation of the at least one region by moving the image.

Typically the method comprises, in the processing system, animating the representation in accordance with at least one of:
   a) a cursor position;
   b) input commands from a user;
   c) movement of the user detected using a sensing system; and,
   d) in response to signals from a motion sensing device.

Typically the image is at least one of:
   a) indicative of a light source effect;
   b) a time varying image;
   c) captured using a camera system;
   d) a simulation of a three dimensional environment; and,
   e) indicative of a reflection.

Typically the method comprises, in the processing system:
   a) determining first parameters relating to the document; and,
   b) modifying the appearance of the region in accordance with the determined first parameters.

Typically the method comprises, in the processing system, determining the first parameters using at least one of:
   a) document content; and,
   b) differences between the at least one region and other regions of the document.

Typically the method comprises, in the processing system:
   a) determining second parameters relating to the image; and,
   b) modifying the appearance of the region in accordance with the determined second parameters.

Typically the method comprises, in the processing system, determining the second parameters based on at least one of:
   a) objects within the image; and,
   b) at least one light source.

Typically the method comprises, in the processing system:
   a) determining third parameters relating to the combination of the image and the region; and,
   b) modifying the appearance of the region in accordance with the determined third parameters.

Typically the method comprises, in the processing system, determining the third parameters based on at least one of:
a) reflectivity;
b) diffusivity;
c) specular values;
d) bump maps;
e) blooming; and,
f) scattering filters.

Typically the method comprises, in the processing system, animating the image by varying at least one of:
a) first parameters relating to the document; and,
b) second parameters relating to the image; and,
c) third parameters relating to the combination of the image and the region.

Typically the method comprises, in the processing system modifying the appearance of the at least one region by applying at least one of bumpiness, height variations, shading, warping and folding to at least part of a surface upon which the said image is rendered to thereby simulate at least one of grain, texture, shininess, reflection, embossing, diffusion, scattering, and specular reflection.

Typically the method comprises, in the processing system, modifying regions other than the at least one region by at least one of blooming and bleeding of a bright portion of the at least one region into the other regions.

Typically the at least one region is to be printed using at least one of:
a) a reflective substance;
b) a substance having a metallic appearance;
c) a substance that is at least partially translucent;
d) a substance whose appearance is dependent on the viewing angle; and,
e) a temperature sensitive substance.

Typically the viewing condition is at least one of:
a) viewing incidence angle;
b) viewing distance;
c) viewing orientation;
d) temperature;
e) time;
f) position of the at least one region upon the print;
g) size of the spot colour region,
h) shape of a print medium;
i) distortion of a print medium;
j) proximity to other substances;
k) proximity to light sources;
l) application of electrical currents;
m) wavelengths of illuminating light.

Typically the document is formed from an image and a template, the template defining the at least one region.

Typically the method comprises, in the processing system:
a) causing the print representation to be displayed to the user; and,
b) causing the document to be printed in accordance with input commands from the user.

Typically the method comprises, in the processing system, determining the at least one region in accordance with at least one of:
a) document content; and,
b) user input commands.

In a second broad form the present invention provides apparatus for providing a print representation of a document which, when printed, has at least one region the appearance of which is dependent on viewing conditions, the apparatus comprising a processing system for:
a) generating a representation of the document; and,
b) modifying the appearance of the at least one region to thereby simulate the appearance of the document when printed by at least one of:
 i) animating the representation of the at least one region; and,
 ii) at least partially combining the at least one region with an image.

In a third broad form the present invention provides a computer program element for use in providing a print representation, the computer program element comprising executable code which when executed on a suitable processing system causes the processing system to:
a) generate a representation of the document; and,
b) modify the appearance of the at least one region to thereby simulate the appearance of the document when printed by at least one of:
 i) animating the representation of the at least one region; and,
 ii) at least partially combining the at least one region with an image.

BRIEF DESCRIPTION OF THE DRAWINGS

An example of the present invention will now be described with reference to the accompanying drawings, in which:—

DETAILED DESCRIPTION INCLUDING BEST MODE

Figure 1:
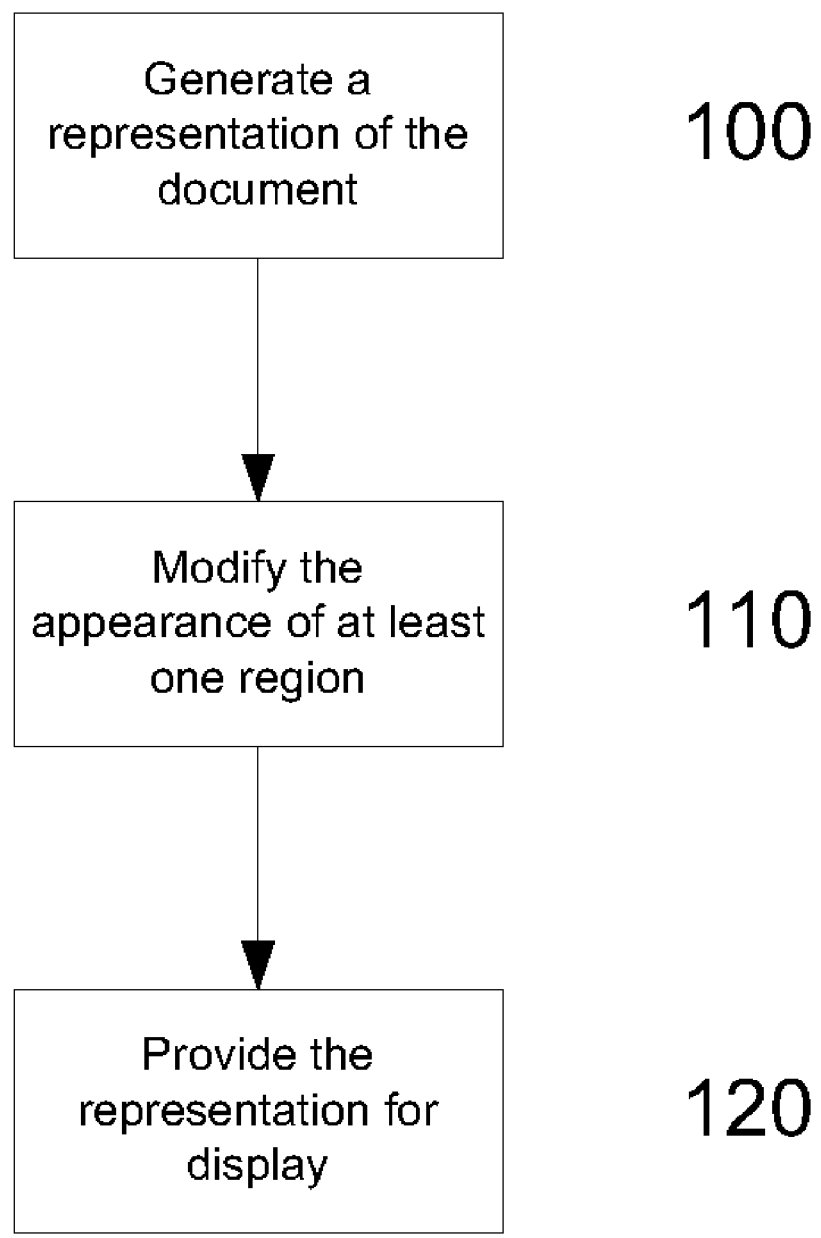
FIG. 1 is a flow chart outlining an example of a process for providing a print representation.

An example of a process for generating a print representation of a document will now be described with respect to FIG. 1.

For the purpose of this example the document to be printed is assumed to include at least one region that when printed has an appearance which is dependent on the viewing conditions. Thus, for example, the region may be printed using ink having different optical properties or characteristics to other regions of the document, such as reflective ink or the like. Further examples of such regions will be described in more detail below.

At step 100 the process involves generating a print representation of the document to be printed. The representation can be generated using any technique, and may therefore be prepared in a manner similar to existing print previews.

At step 110 the appearance of the region is modified to thereby simulate the appearance of the document when it is printed. This may be achieved in a number of ways depending on the implementation and optionally depending on the nature of the region. Thus, for example, the region can be animated, for example by dynamically varying the colour of the region, or can be modified by combining the region with, or overlaying, another image, for example to represent a reflection. Alternatively, a combination of the two may be performed where the animation is achieved by overlaying another image, which is then moved with respect to the region.

Once the modification is performed, this allows the print representation to be provided for display to a user at step 120, thereby allowing users of the process to assess whether the physical printout will have the desired appearance.

Figure 2:
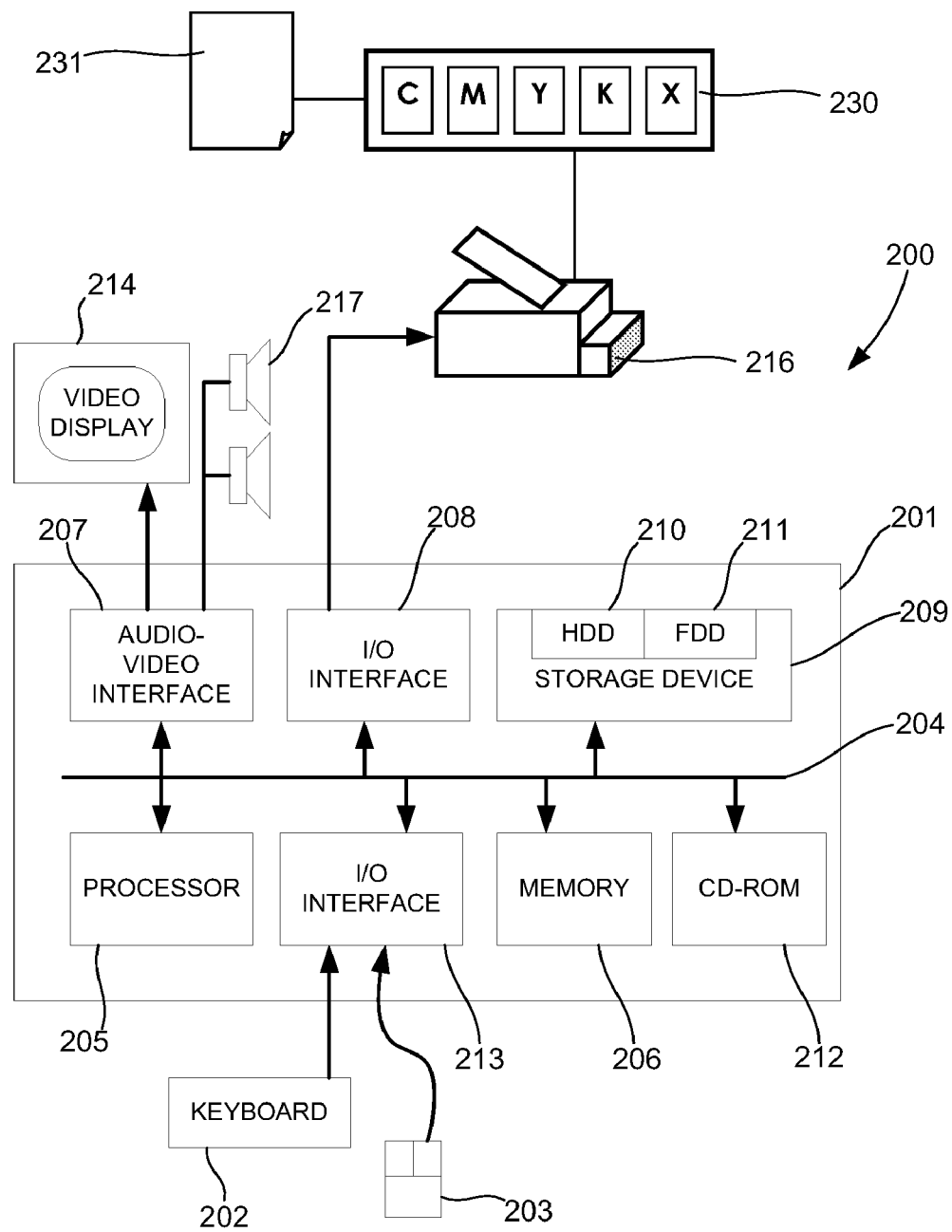
FIG. 2 is a schematic diagram of an example of a computer system.

The process is generally performed using a general-purpose computer system, and an example of a suitable system is shown in FIG. 2.

In this example, the computer system 200 is formed by a computer module 201, input devices such as a keyboard 202 and mouse 203, and output devices including a printer 216, a display device 214 and loudspeakers 217, which are typically connected to appropriate interfaces 207, 208, as shown.

The computer system may also be connected to a communications network, such as the Internet, the Web, or other network systems, such as a Local Area Network (LAN) or a Wide Area Network (WAN), which are not shown in this example for the purpose of clarity only.

The computer module 201 typically includes at least one processor unit 205, and a memory unit 206, for example formed from semiconductor random access memory (RAM) and read only memory (ROM). The module 201 also includes an number of input/output (I/O) interfaces including an audio-video interface 207 that couples to the video display 214 and loudspeakers 217, an I/O interface 213 for the keyboard 202 and mouse 203 and optionally a joystick (not illustrated), and an I/O interface 208 for the printer 216 (and optionally for connecting to communications networks).

A storage device 209 is provided and typically includes a hard disk drive 210 and a floppy disk drive 211. A magnetic tape drive (not illustrated) may also be used. A CD-ROM drive 212 is typically provided as a non-volatile source of data.

The components 205 to 213 of the computer module 201, typically communicate via an interconnected bus 204 and in a manner that results in a conventional mode of operation of the computer system 200 known to those in the relevant art. Examples of computers on which the described arrangements can be practised include IBM-PC's and compatibles, Sun Sparcstations or the like.

The process of providing print representations, and optionally subsequently creating printouts by printing documents, is typically implemented using software, such as one or more application programs executing within the computer system 200. Typically, the application activates a graphical user interface (GUI) on the video display 214 of the computer system 200 which displays documents to the user in the form of a print representation or similar, allowing the user to view the document prior to printing.

The methods and processes are affected by instructions in the software application that are carried out by the computer. The instructions may be formed as one or more code modules, each for performing one or more particular tasks.

The software may be stored in a computer readable medium, and loaded into the computer, from the computer readable medium, to allow execution. A computer readable medium having such software or computer program recorded on it is a computer program product. The use of the computer program product in the computer preferably affects an advantageous apparatus for viewing documents to be printed.

Typically, the application program, by which a user of the computer 200 can view documents for printing is resident on the hard disk drive 210 and read and controlled in its execution by the processor 205. Intermediate storage of the program and any documents for printing may be accomplished using the semiconductor memory 206, possibly in concert with the hard disk drive 210. In some instances, the application may be supplied to the user encoded on a CD-ROM or floppy disk and read via the corresponding drive 212 or 211, or alternatively may be read by the user from the network via a modem device or the like. Still further, the software can also be loaded into the computer system 200 from other computer readable media.

The term "computer readable medium" as used herein refers to any storage or transmission medium that participates in providing instructions and/or data to the computer system 200 for execution and/or processing. Examples of storage media include floppy disks, magnetic tape, CD-ROM, a hard disk drive, a ROM or integrated circuit, a magneto-optical disk, or a computer readable card such as a PCMCIA card and the like, whether or not such devices are internal or external of the computer module 201. Examples of transmission media include radio or infra-red transmission channels as well as a network connection to another computer or networked device, and the Internet or Intranets including e-mail transmissions and information recorded on Websites and the like.

In one example, the printer 216 is formed from a printer that is capable of printing Cyan, Magenta, Yellow and Black, (CMYK printing), as well as a custom spot colour (κprinting). This is achieved using a special configured printhead 230 includes CYMKX inks, and is capable of printing these onto media 231 based on appropriate instructions from the computer system 200. It will be appreciated that this is achieved in a manner similar to standard printers and this will not therefore be described in any further detail.

Figure 3:
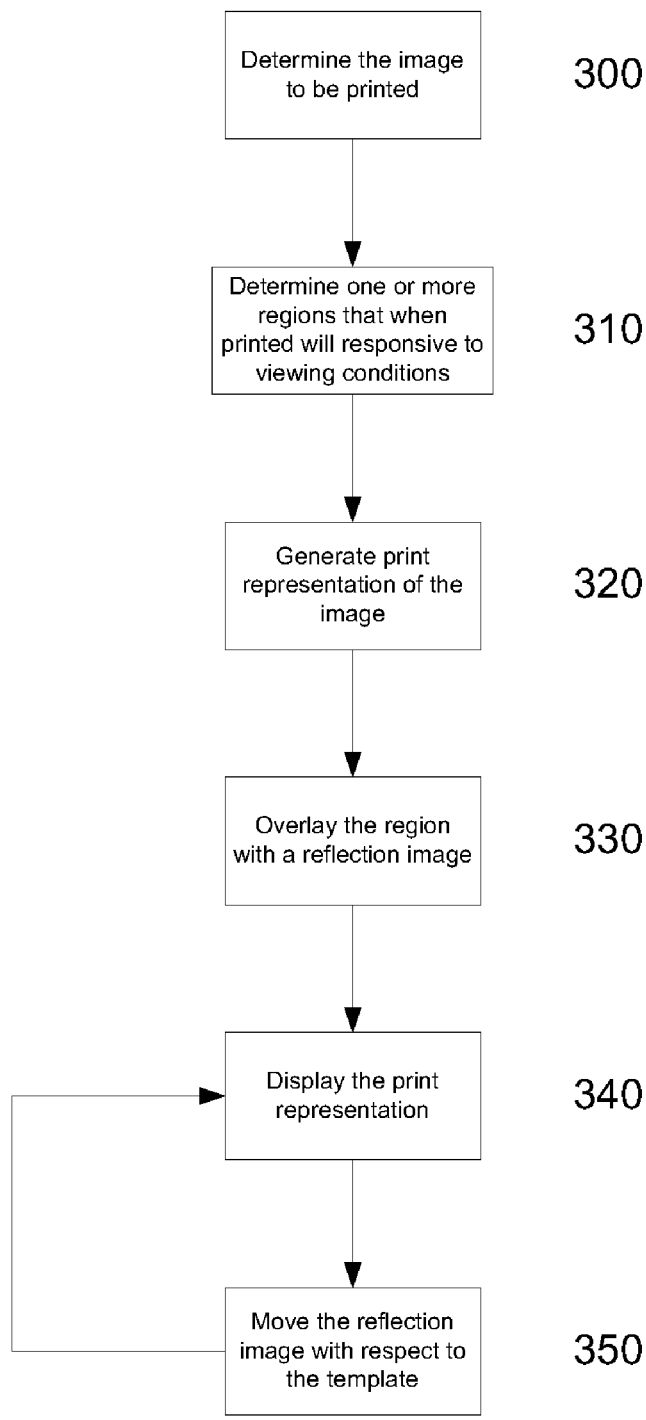
FIG. 3 is a flow chart of an example of a process for providing a print representation.

When using the computer system the procedure is typically as shown in FIG. 3. For the purpose of this example it is assumed that the document to be printed is an image similar to the image shown in FIG. 4A at 400.

In this example, at step 310 the computer system operates to determine one or more regions the printed appearance of which is dependent on viewing conditions. The form of such regions and the manner in which these are determined may vary depending on the implementation and the nature of the region.

Figure 4A:
FIG. 4A is a schematic diagram of an example of an image to be printed.
Figure 4B:
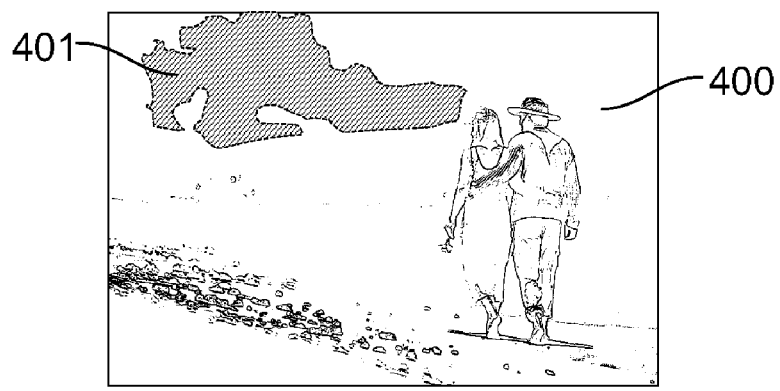
FIG. 4B is a schematic diagram of an example of a selected region in the image of FIG. 4A.

Thus, in FIG. 4B, a region 401 is formed within the image 400 as shown. This may represent, for example, a cloud within the image that the user wishes to print using reflective silver ink. In this case, the user may outline the cloud manually, using an appropriate input device, such as the mouse 203, or the cloud may be detected automatically using image processing software, such as an image editing application.

Figure 4C:
FIG. 4C is a schematic diagram of an example of a template defining a region in the image of FIG. 4A.

Alternatively, the region may be added to the image, as shown for example in FIG. 4C, in which a template 402 is combined with the image 400, thereby allowing a frame to be printed using a spot colour, or the like.

In this example, once the region is determined, the computer system 200 generates a print representation of the document at step 320, before modifying the region. For the purpose of this example, it is assumed that the region is a reflective region, and accordingly, the modification is performed by combining the region with an environment (generally referred to as a reflection environment) at step 330.

The reflection environment may be obtained in any one of a number of ways and could include for example a simulated reflection, an image of a real environment, such as a picture of the user, or may simply be an artificially generated environment indicative of lighting effects or general objects.

Figure 4D:
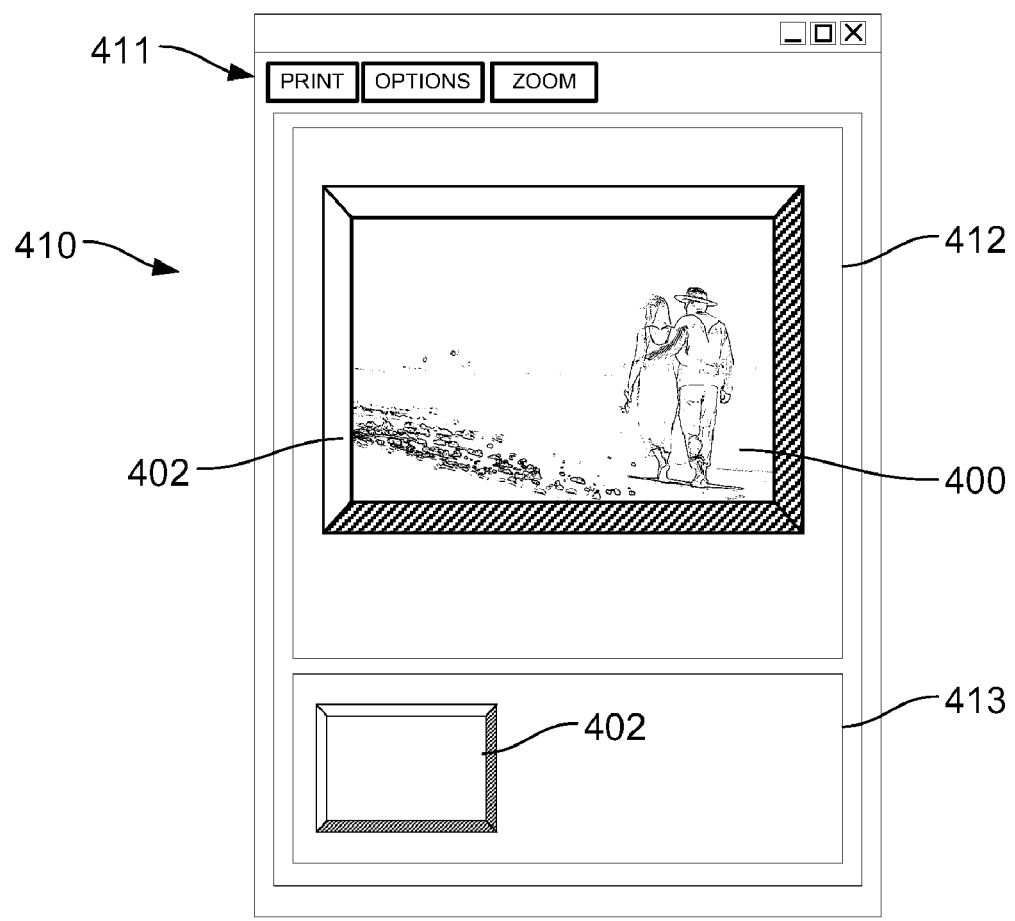
FIG. 4D is a schematic diagram of an example of a graphical user interface for viewing a print representation.

At step 340 the print representation can then be displayed to the user. This is typically achieved using a suitable GUI (Graphical User Interface) an example of which is shown in FIG. 4D.

The GUI 410 includes input buttons 411 allowing the user to effect various print and previewing operations, such as printing the document, selecting viewing options, or zooming the print representation forming the print preview.

In this example, the GUI 410 includes a first window 412 for displaying the generated print representation, whilst a second window 413 is also provided for displaying one or more templates that may be applied to the image, as shown for example by the template 402.

Thus, in one example, the user can be presented with the GUI 410 initially including the image 400 in the window 412 and one or more available templates 402 in the window 413. Once the user has selected a desired template 402, the template 402 is added to the image to form the document to be printed. The reflection environment can then be combined with the region defined by the frame, thereby generating the print representation that allows the physical printout to be simulated.

Once the print representation is displayed, this can then be animated at step 350 by moving the reflected environment with respect to the region. The movement of the reflection environment may be performed in any one of a number of ways and may be automatic, based on user inputs, based on detected movements of the user or the like.

It should be noted that during the movement process, the reflection environment is only ever combined with the region whose appearance is viewing condition dependent. Thus, in this example, the reflection environment is only ever combined with the region defined by the template 402 and would not influence the appearance of the remainder of the image 400. However, it will be appreciated that in some examples, the region whose appearance is viewing condition dependent could be the entire page, if for example, printing on glossy paper is being simulated.

The movement of the environment results in a dynamic appearance for the region, which in turn helps simulate the responsiveness of the region to varying viewing conditions.

In the above example, the print representation may be generated by a first application, which then provides the print representation to a second application to allow it to be displayed to the user. This allows the displaying of the print representation to be controlled using existing applications on a user's computer system, with the print representation being generated by a plug-in module, or the like. Alternatively, the process may be performed using a single integrated application.

In any event, the above described process allows the print representation of a document to be modified by animating the region and/or combining the region with a reflection environment, thereby allowing the user to perceive the responsiveness of the physical printout to viewing conditions. This in turn provides the user with a more intuitive feel as to the appearance of the physical printout and whether this satisfies their requirements, allowing them to make an informed decision as to whether the document is suitable for printing.

Accordingly, this allows the user to preview a document to be printed with substances, such as reflective or glossy inks, dyes, toners, paints, films, lacquers, or other printing substances which may otherwise be difficult to represent with standard techniques.

A number of specific examples will now be described.

Whilst the majority of the explanation will be with respect to reflective printing substances, it can be easily seen that similar techniques can be used to provide accurate previews of other printing substances such as substances whose appearance varies markedly according to viewing angle, application of UV light, heat, or the like.

Animated Previews of Reflective Substances

Figure 5A:
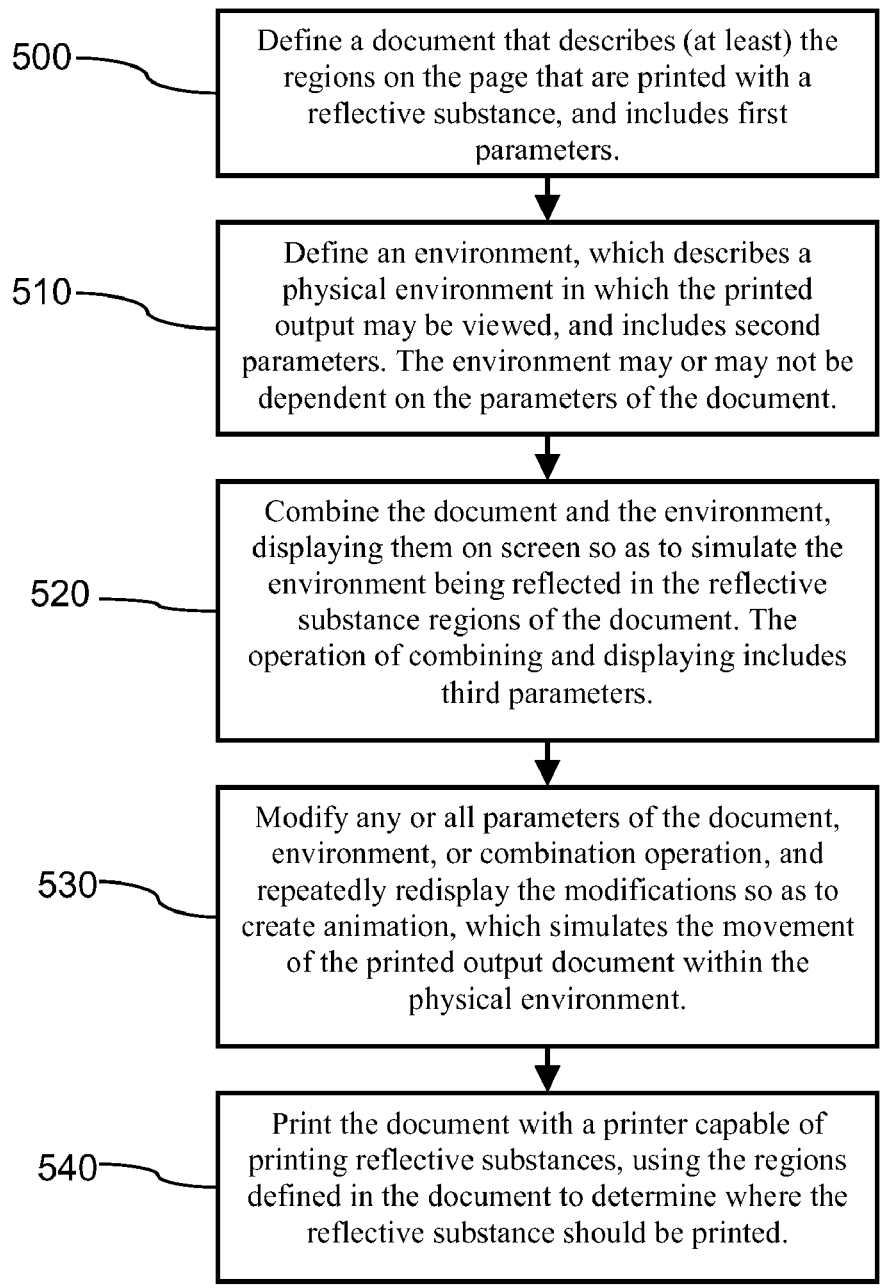
FIG. 5A is a flow chart of a specific example of providing a print representation when printing a document using a reflective substance.

A specific example of previewing documents incorporating reflective inks will now be described with respect to FIG. 5A.

In the first step 500, a document is defined which describes (at least) the regions on the page that should be printed with a reflective substance, and may also include other regions which are to be printed with normal printing processes or normal spot colours. The document is defined by various first parameters. The document, the regions, or the choices of reflective substances may depend on a combination of user input, automatic selection or analysis.

In the second step 510, an environment is defined, which describes a hypothetical environment in which the physical printout may be viewed, and therefore represents the viewing conditions. This environment is defined by various second parameters, and may include images, light sources and other objects that may reflect within the reflective regions of the document defined in the first step. The environment may be pre-defined, or it may be dependent on the parameters of the document, on user input, on an automatic process, on the physical surrounds of the user, on some combination of these, or other criteria.

In the third step 520, at least some of the first and second parameters from the document and environment are combined to form a print representation, which is displayed on screen as a print preview so as to simulate reflecting parts of the environment (defined in the second step) within at least the reflective substance regions of the document. The operation of combining and displaying includes third parameters.

In the fourth step 530, any or all parameters of the document, environment, or combination operation are modified, the print representation is regenerated, and each such modified print representation is repeatedly redisplayed so as to create animation, which simulates rotation or change in orientation or other movement of the physical printout within the hypothetical environment. This step may involve user input to control the animation or other normal print preview operations, or it may involve automatic processes, or some combination of these.

In the final step 540, the document can be printed using a printer capable of printing reflective substances, using the regions defined in the document to determine where the reflective substance should be printed.

Figure 5B:
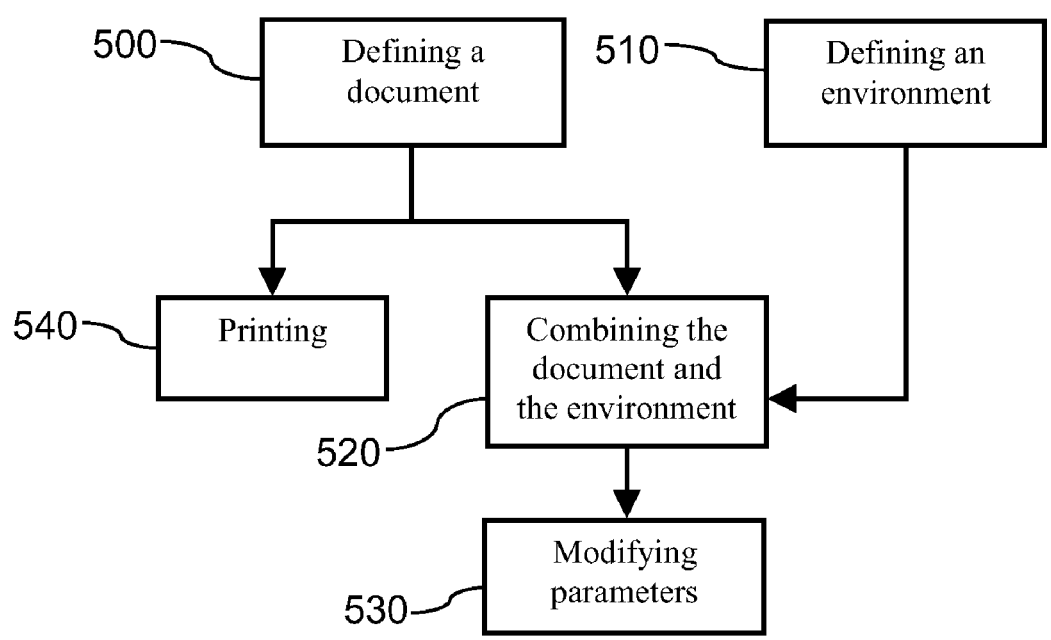
FIG. 5B is an example of the flow chart of a FIG. 5A ordered to show relative dependencies between the steps.

FIG. 5B shows how each of these steps may be independently controlled and may occur in any order to produce an animated print preview, with a few exceptions. The third step 520 depends on first and second parameters from steps one 500 and two 510, and must therefore occur after at least some of those parameters from those first two steps have been decided.

This third step 520 essentially produces the first frame in the animation, and so must occur before the fourth step 530. Thereafter, modifications to the first, second and third parameters may be interleaved with the animation step.

The fifth step 540 may occur even before the second, third or fourth steps, but requires that at least the parameters from the first step needed to begin printing have been decided.

There are many possible variations and alternative implementations of each of these steps, which will be described in turn in the following sections.

Defining the Document

The purpose of this first step is to define a document that includes, amongst other parameters, at least one region to be printed using at least one reflective substance (a reflective region). This can be achieved in a number of ways such as selection by the user or automatically from a set of related documents, and reflective regions could be selected by automatic analysis or by the use of templates.

The user might select a document to be printed, via an input device such as a keyboard or pointing device. Or a document (such an a photo) may be obtained from a camera, possibly dynamically from a camera attached to the same device that is producing the print preview. Or, the user might select a set of documents, and the print preview might be applied in miniature or successively to each document within that set. Or, an automatic process might be applied to choose documents from a set which match a certain criteria, for example, those documents which are wider than they are tall, or which have a certain colour profile or certain features (such as photos which show faces or scenes of nature). Many combinations of these document selection options are possible. The reflective regions may be pre-defined (already associated with these documents), or a later process might define these regions, or both.

Several methods of automatic analysis could be used to decide which regions of a document are reflective. A photo could be analysed to determine which regions are suitable for printing with reflective substances, according to some criteria. In the example of FIG. 4A, the photo can be analysed according to the criteria that only very bright regions are suitable, such as white clouds, which are then automatically selected as shown in FIG. 4B. Other darker areas are determined not to be suitable and are therefore printed using other standard colours.

Other criteria are possible, such as regions of high contrast or of a particular range of colours, and the process to determine the regions can be entirely automatic, or partly user controllable.

If templates are used, a photo is combined with artwork, typically a photo frame or clip art, and the artwork determines at least some of the regions to be printed with reflective substances, as described above with respect to FIG. 4C.

Further examples of templates will now be described.

Figure 6:
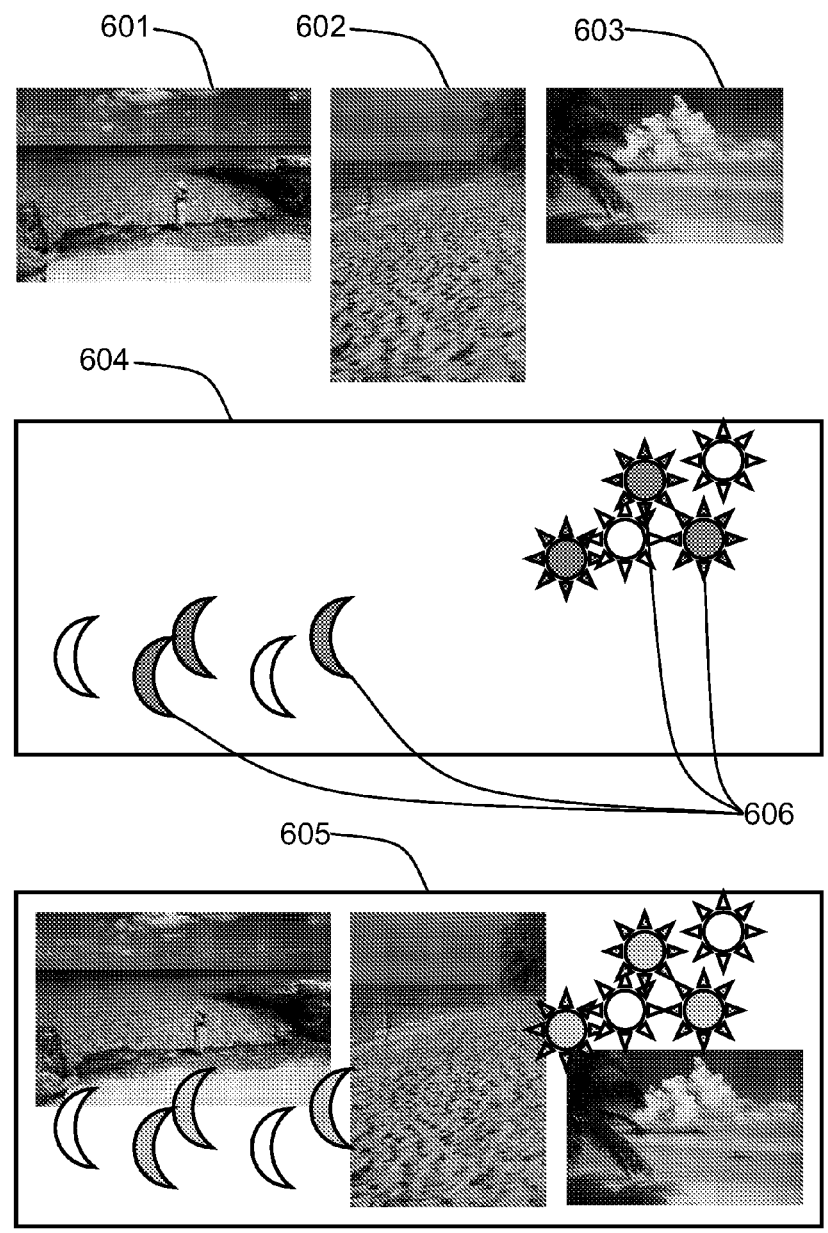
FIG. 6 is a schematic diagram of an example of the process of combining pictures with a template.

In the example shown in FIG. 6 multiple photos 601, 602, 603 are combined with a single template 604 to produce a document 605. As before, the template contains regions 606 to be printed with reflective substances.

The template may be either a static template which may only be scaled to fit a selected photo, or it may be a dynamic template, which includes a series of rules or other algorithms which define how the template size or shape varies with respect to aspect ratio, colour, size, or other attributes of a selected photo or printing substance.

Templates may be grouped into sets and a user-controlled or an automatic decision may be used to select from that set which template to use for a particular purpose. The templates within such a set may have variations, for example they might differ by colour, shape or some enumerated style, but be otherwise similar. Typically a template set may consist of several static templates, but dynamic templates might also be grouped into a set.

Figure 7:
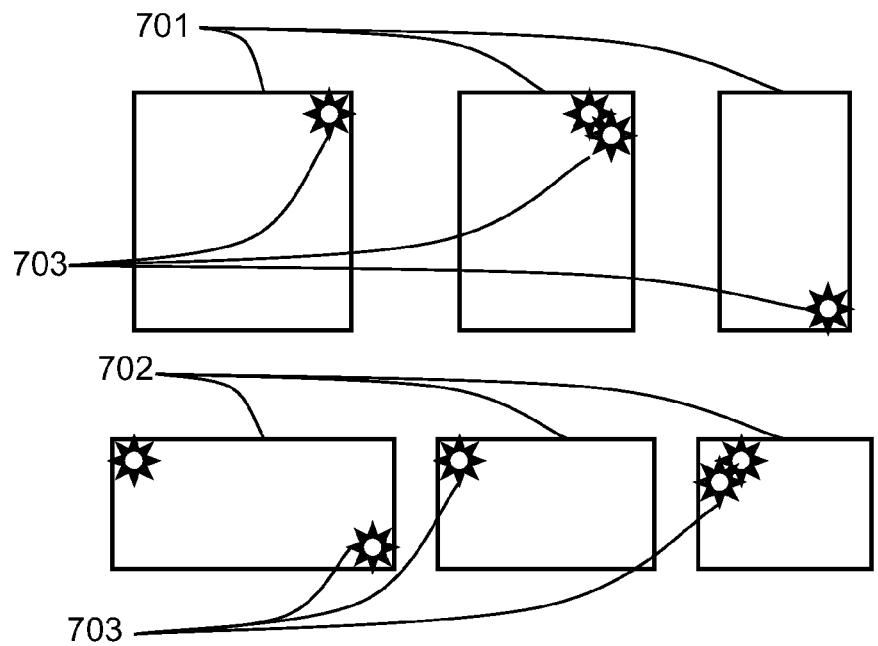
FIG. 7 is a schematic diagram of an example of a set of templates.

FIG. 7 shows a set of templates that consists of multiple variations. Some variations are tall or portrait 701, while some variations are wide or landscape 702. In addition, each template has artistic variations through the use of embellishments 703, although the variations are slight so that the templates retain a similar appearance. In this example, the user selects the set of templates but not a specific template, and the ratio of width to height of a selected photo is used to automatically control which of these templates is actually used.

Template variations must be chosen in some manner. Users may choose for themselves, the variation can be chosen automatically, or there can be some combination of both. For example, if the template set variations involve colour, some automatic analysis of a photo might determine which colour template to use from the set.

Figure 8:
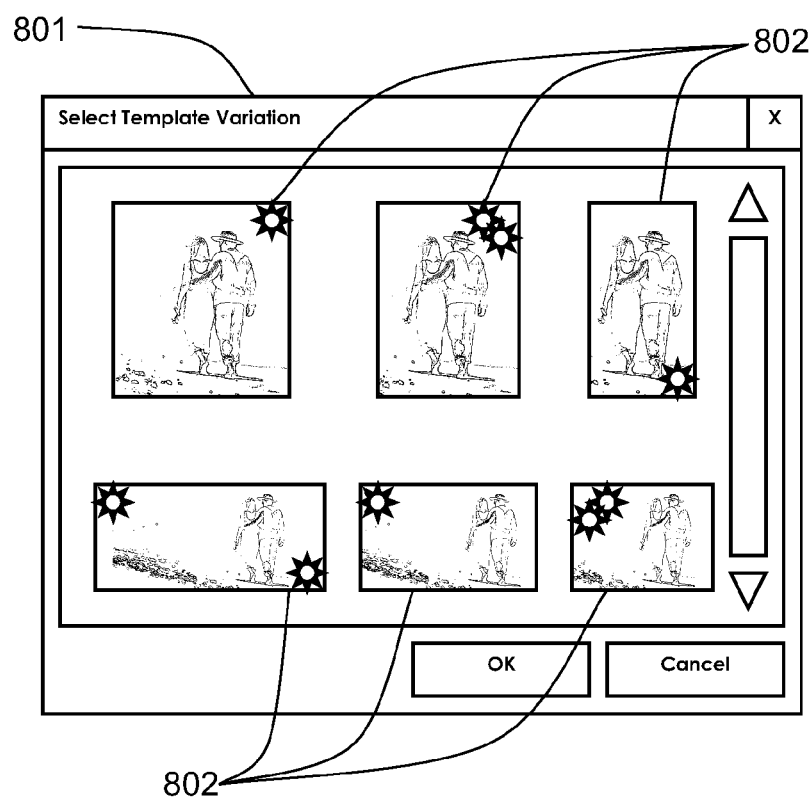
FIG. 8 is a schematic diagram of a graphical user interface for presenting a series of templates.

FIG. 8 shows a user interface 801 displaying a series of thumbnails 802, each thumbnail being a copy of a selected photo combined with a template variation. Users can choose a variation by selecting one of the thumbnails using an input device.

Figure 9:
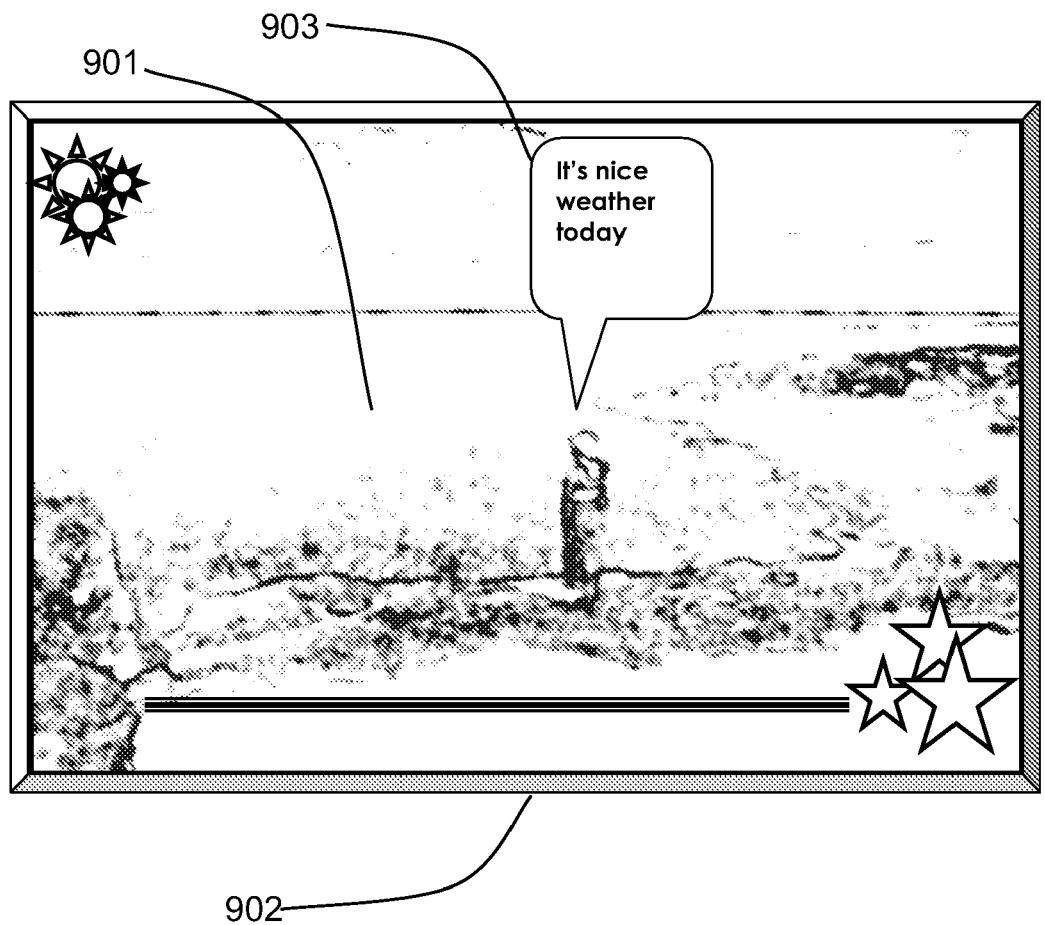
FIG. 9 is a schematic diagram of an example of a picture and an automatically selected template.

FIG. 9 shows an example in which a photo 901 with a template variation 902 that has been automatically chosen. The photo has been analysed, and determined to be landscape, and so a landscape template variation has been chosen. In addition, the top left corner, the bottom side, and the bottom right corner of the photo have been determined to be regions of low visual frequency, and so a template variation with artwork in those regions has been chosen. Other analyses are also possible, such as face detection, to decide which sets of templates may be used.

It will be appreciated that a wide range of options for template selection are available including for example a combination of automated and manual selection, the use of dynamic and/or rules based resizing, or the like.

Clip-art may also be combined with an photo to define the spot colour regions, as shown for example at 903 in FIG. 9, which shows a speech bubble, within which the user has typed text which is combined with that clip-art object.

Clip-art refers to pictures which may define opaque, translucent, or transparent regions as well as regions which are to printed using spot colour substances (including reflective substances in this case). The clip-art may be static (able to be resized by simple scaling methods) or dynamic (having reshaping rules similar to those discussed earlier for dynamic templates). Such clip-art objects may be selected by the user, by an automatic process, or both. Multiple clip-art objects may be chosen, and overlaid by placement, rotation, scaling or other transformations so as to combine with a photo, to define the final document. For example, the user might choose clip-art 'bling-bling' (metallic-looking jewelry) to add over a photo of friends or family members, and such 'bling-bling' could be printed with a golden reflective substance to convey the appearance of gold.

Regardless of the method used, the end result of this first step is a document including various first parameters, at least some of which define regions on the document that are intended to be printed with at least one reflective substance.

Defining the Environment

The purpose of this step is to define an environment that includes, amongst other parameters, environmental conditions including pictorial information suitable for reflecting in the reflective regions of the document constructed from the first step. This environment can be determined in a number of possible ways, and in one example can consist of two components: a picture component and a light source component.

The picture component can be a stock picture, a photo, the original document, a computer generated abstract picture, or a video stream. In all cases, the picture component can consist of either a 2D image or a 3D scene, because suitable pictorial information can be generated from either one.

For a stock picture or scene to be used in the environment, the picture or scene can be composed of blobs of colour, or detailed artwork. It may include a scene reminiscent of a typical office or home scene, perhaps including a face. Or there may be multiple stock pictures or scenes, from which a choice is made based on the parameters of the document from the first step.

If a photo is selected in the first step, that original photo may be modified and used as part of the environment, or it could be used to generate a 3D scene which can be used as the environment. Automatic analysis could be used to modify the colours, level of detail, or other information within that photo when it is used within the environment.

For a computer generated abstract picture to be used in the environment, a picture or scene with general properties of a reflection can be generated, which may not correspond to any real-world environment. For example, it may have diffusion or scattering properties designed to mimic the properties of a picture reflected from a physical reflective substance such as the ink, dye or printing substance to be used. This computer generated picture can also be made to specifically suit the parameters of the document from the first step.

For a live image or video stream to be used in the environment, an image or video frame can be captured, modified or otherwise produced from an image capture device, such as a web camera or handheld digital camera. In this case, the image or frame can be of the user, which provides for an effect that more closely resembles the physical printout.

These frames may be captured and updated dynamically during the forthcoming animation step, so that constant feedback is provided during the print preview, or they may be captured once, by user selection or by some automatic selection process (such as waiting for the best focus to be obtained, or the best contrast).

Figure 10:
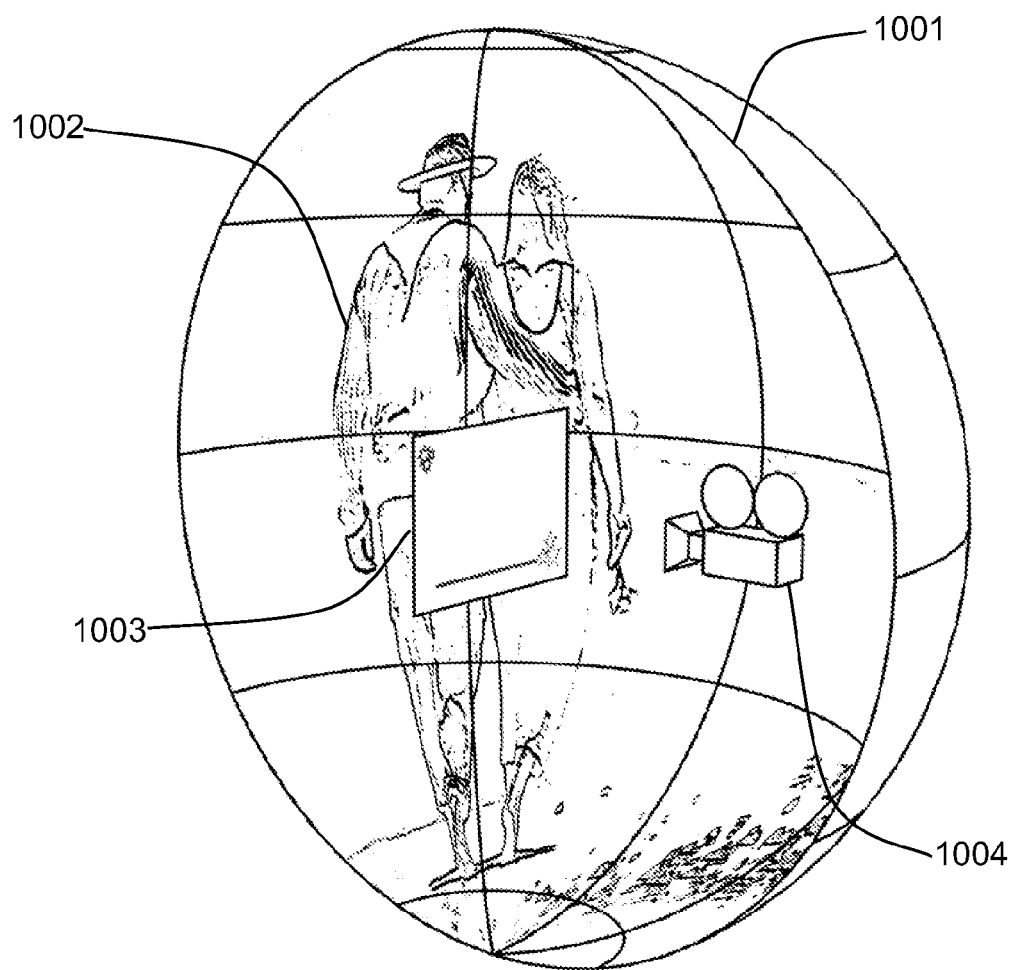
FIG. 10 is a schematic diagram of a first example of a 3-D environment.

FIG. 10 is an example of a 3D scene consisting of an environmental sphere 1001 with a picture used to texture the inner surface 1002. The document 1003 as generated by the previous step lies at the centre of the sphere, and the viewpoint 1004 from which visible reflections are calculated lies in front of the document, within the sphere.

Figure 11:
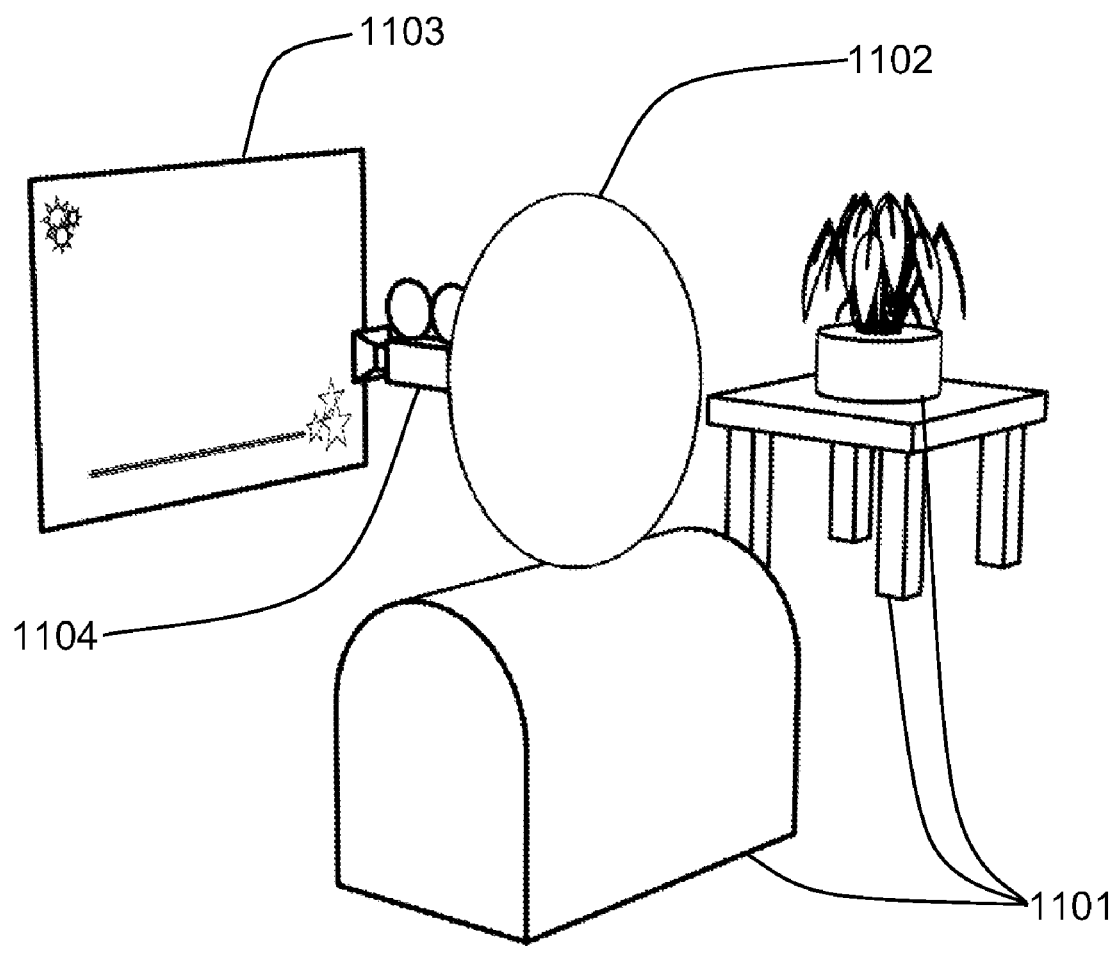
FIG. 11 is a schematic diagram of a second example of a 3-D environment.

FIG. 11 is an example of a 3D scene consisting of several 3D objects 1101 arranged in an environment, together with an object representing the viewer's face and torso 1102. The document 1103 as generated by the previous step lies in front of the simulated viewer, and the viewpoint 1104 lies close to the simulated viewer's eyes.

The picture may also undergo modification prior to use in the reflection environment, for example, by blurring or otherwise modifying the picture, to thereby mimic imperfect reflectivity of the reflective material when printed.

The light source component of the environment can consist of either two dimensional (2D) light spots, or three dimension scene (3D) point light sources, or other combinations of simulated glowing objects or light sources.

Figure 12:
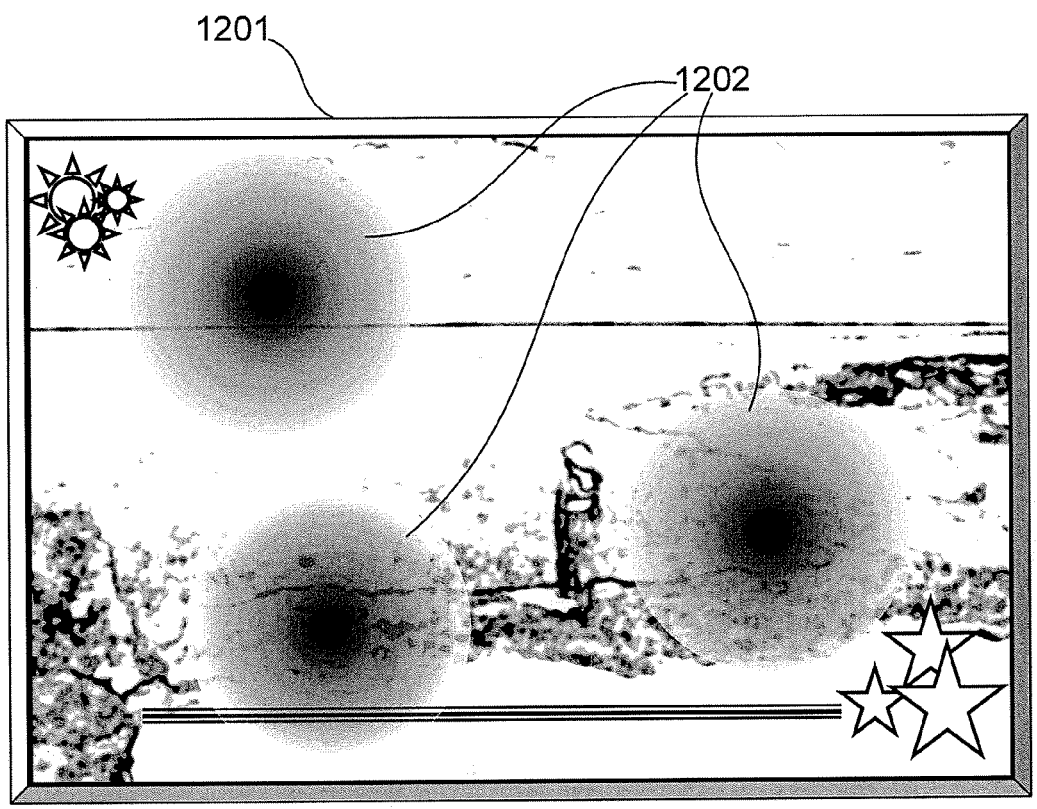
FIG. 12 is a schematic diagram of an example of an image modified with light sources.

FIG. 12 is an example in which a document 1201 includes light sources 1202. A 2D light spot is a circle of colour, with partial transparency and soft edges. In this example, for the purpose of reproduction, the light sources are shown as a dark spot as opposed to a light spot. When overlaid onto a document, 2D light spots can provide the impression that spotlights are being shone onto the document. Also, they can be incorporated into the combining step without the need for 3D calculations, while still simulating a 3D environment by appropriate co-ordination between the motions of the 2D light spots.

A 3D point light source is a more conventional method of simulating light in an environment. The light source has a position in a 3D environment, and other parameters, such as light colour, intensity, and falloff. While they require 3D calculations for the combining step, they allow more realistic operations like bump maps to be used.

Regardless of the method, the end result of this second step is an environment, defining environmental conditions with various second parameters, at least some of which define a reflection picture, and zero or more light sources.

Combining the Document and the Environment

The purpose of the combining step is to combine the document and the environment to produce and display a still representation of the document (being a single frame in the animation), with the environment being reflected in the regions to be printed with reflective substances. Broadly speaking, there are two main methods that can be employed: 2D techniques, and 3D techniques. Furthermore, some methods are common between the two techniques.

Of the 2D techniques, the simplest is to take a reflection picture generated from the environment, optionally mirroring and replicating or scaling it, and displaying it inside the reflective regions of the document produced by the first step. This provides a perfectly flat mirrored look to the reflection. Optionally, the hue and intensity of reflective regions may be adjusted to match properties of the printed substances, for example reflections may be biased towards a golden colour if the printout would use a reflective golden dye, or small bright silvery dots may be added if the printout would use a glitter-filled transparent ink.

A different technique, which may better simulate the properties of a real printing substance, is to apply a scattering filter to the pixels of the reflection picture as it is being displayed in the reflective regions. The filter can produce random scattering, but it is preferable to have some structure to the scattering, which gives the illusion of physical bumps on the surface of the reflective regions. This can be done in any number of ways, including by taking a height map of a bumpy surface, where each point in the height map corresponds to a point on the document, calculating a vector normal for each point in the map according to the surface of the height map at that point, then for each pixel in the reflection picture, using the vector at the corresponding point on the normal map to determine which source pixel to colour the current pixel with.

Figure 13:
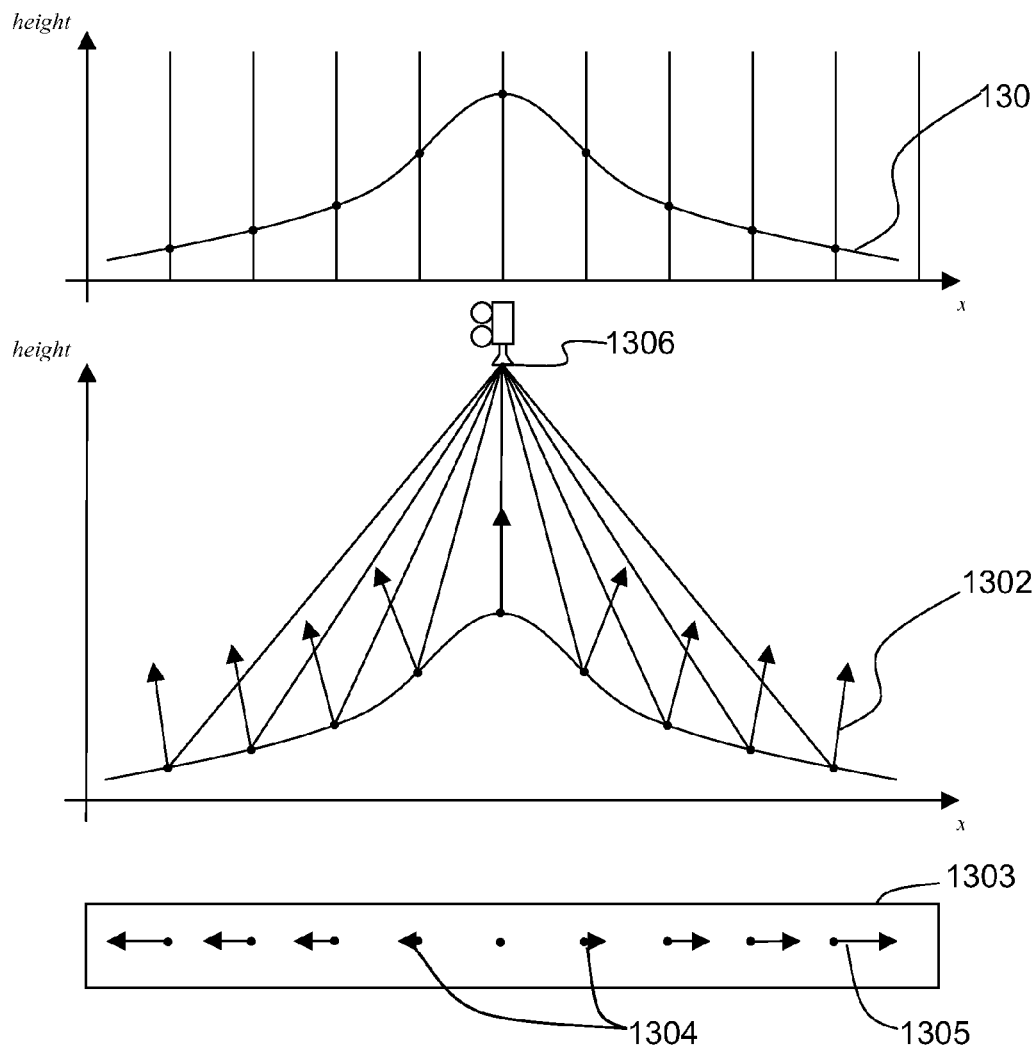
FIG. 13 is a graphical representation of scattered filtering in 2-D.

FIG. 13 shows the principles of a structured scattering filter in 2D, for illustration purposes. A height map 1301 describes the intended height of the bumps on the surface to be simulated. A normal map 1302 is generated from the height map, and describes the normal at each sampled point on the height map. Each normal is combined with the intended viewpoint 1306, to produce an offset vector, which makes the scattering filter 1303. Each offset vector points in the direction of the area on the surface which would be reflected in the sampled point for that offset vector, based on the normal at that sampled point. That is, where a normal is close to parallel to the direction of view, the offset vector is small 1304, whereas a normal close to perpendicular to the direction of the view results in a large offset vector 1305.

In combination with either of these 2D techniques, 2D light spots from the environment can be used to show highlights on the reflective regions. The light spots are taken from the environment and blended within the reflective regions, according to positions specified in the environment.

Of the 3D techniques, the simplest is to trace reflection rays from the 3D camera, to the reflective regions, to the pictures or objects in the environment. This provides a perfectly flat mirrored look to the reflection.

More realism can be gained by applying a bump (or normal) map to the surface of the reflective regions. The diffuse properties of the surface can also be modified to improve the look. Such bump maps may be used to add glints to the edges of reflective regions, or to other detailed features such as text. Bump maps may mimic the physical bumpiness of the printing surfaces or substances, or they may be applied in order to make the preview appear more like a truly reflective printout, even if the bump map varies somewhat from the real bumpiness of a physical printout.

It will be appreciated that any of the above 2D or 3D techniques can be implemented regardless of whether the environment is of a 2D image or a 3D scene.

In combination with these 3D techniques, lighting techniques can be optionally employed where specular reflections for any 3D point light sources in the environment can be generated. Also, the whole document can optionally be mapped onto a curved, folded or tilted object to represent the printed paper output in 3D space.

There are three further techniques that are common to both 2D and 3D methods, and can be used in combination with any of the methods previously described.

Blooming (or luminosity bleeding) can be performed, after colour values and intensities have been determined for the reflective areas, by taking any regions that are bright enough, and applying a filer to them selectively. The blooming filter applies a flare or halo to the immediate vicinity of the regions, causing the brightness to bleed and brighten the immediately neighbouring (possibly non-reflective) areas. The visual effect is to make the bright areas appear over-bright.

Figure 14A:
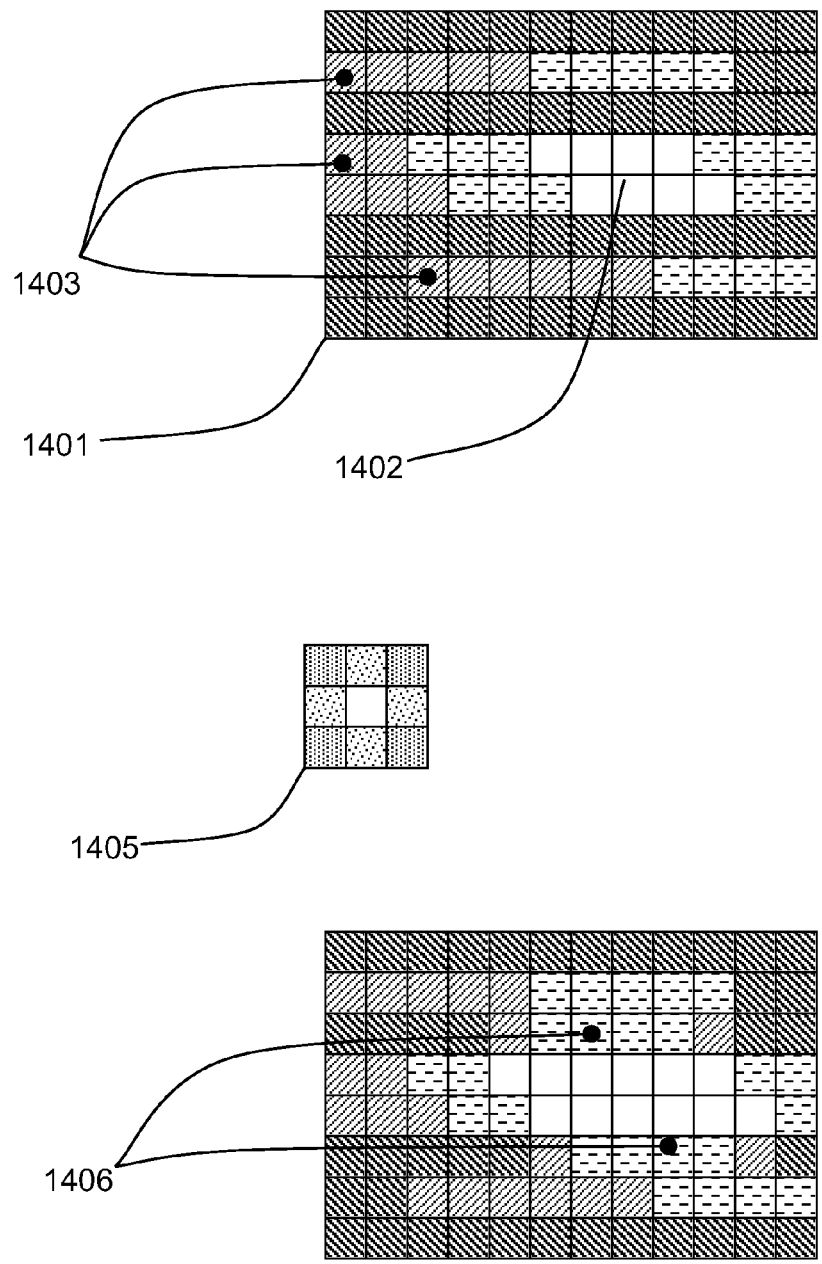
FIGS. 14A and 14B are schematic diagrams of an example of the use of blooming in producing print representations.
Figure 14B:
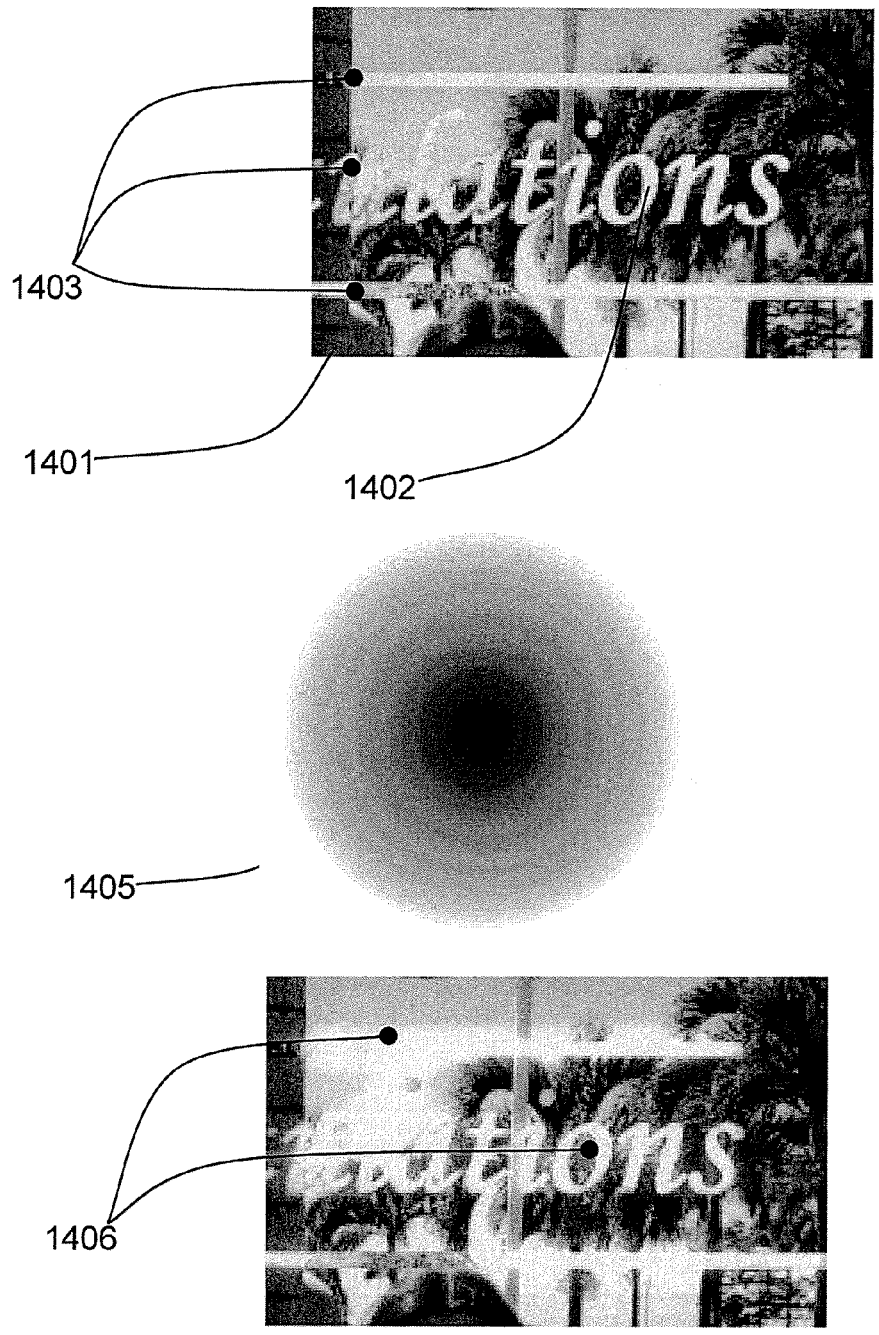

An example of this process will now be described with respect to FIGS. 14A and 14B. For the purpose of clarity, FIG. 14A is a low-resolution pixel representation of the images of FIG. 14B.

In this example, using any of the previously described techniques, an image 1401 is generated, and a reflection is produced within the reflective regions 1402. Part of the reflection shows a bright highlight 1403. This area is determined to be bright because the pixels values are brighter than a specified threshold. For each bright pixel in the highlight area, a blooming shape 1405 is added to the image. The shape is typically a white circle, with an opaque centre, fading to transparent edges (for illustrative purposes only, in FIG. 14B, the circle is drawn in black, and is not shown to scale).

The shape is centred on the current bright pixel, and overlaps indiscriminately onto all neighbouring pixels 1406 in the image. Successive bright pixels cumulatively add their blooming shapes to the neighbouring pixels in the image. When all bright pixels have been completed the bright area appears to bleed into the surrounding areas, providing an over-bright appearance.

Lens flare effects can be performed, to simulate light sources shining into a camera lens, after reflecting from a surface. Typically such lens flare effects create bright circular artefacts, and these artefacts may also be combined with blooming to achieve more realistic simulations of lighting.

Also, any reflective or lighting techniques can be applied, with modified settings, to non-reflective regions as well as reflective regions. This can provide the non-reflective regions with a glossy or shiny appearance, which is beneficial if the print medium is a glossy or shiny paper or other surface. Typically, the settings would be modified so that the reflective regions still appear more reflective and shiny than the non-reflective regions. This technique is discussed further below.

In all of these techniques, measurements of the physical properties of the spot colour substances may be made and incorporated into the utilised parameters to make the print preview simulate reality closely. For instance, the distortion properties of a printing substance might be measured by photographing a test pattern reflected by a sheet printed with that substance. Any distortions introduced into the reflection by the spot colour sheet can be analysed to deduce distortion parameters that may be recorded and used in this step and for animation. Similarly other physical properties, such as how lighting conditions, wavelength or angles affect the display properties of substances can also be measured and used in the simulation.

Although these techniques may be used, it may suffice to use artistic judgement of the parameters to achieve a good effect. Indeed, it may be necessary to vary the simulation from the physical parameters in order to produce an effect on screen which seems real, just as unnatural levels of light or makeup are often used in motion picture photography to make a projected image seem real to an audience.

Regardless of the techniques employed, the end result of this third step is a single still frame of the print preview animation, with the environment being reflected in at least the regions to be printed with reflective substances, according to various third parameters.

Modifying the Parameters and Redisplaying

The purpose of this step is to animate the print preview, by generating new frames as in the previous step. Broadly speaking, there are two components of this animation step: the objects that can be animated; and how their animation is controlled.

For the objects that can be animated, any parameters that contributed to the first three steps can be modified, and such modifications can be used to produce animation. This set of modifiable parameters includes the first parameters from the document, such as the reflective regions, the template, parts of the template, or the photo itself. It also includes the second parameters from the environment, such as a picture to be reflected, light sources, light spots, objects in the 3D reflective scene, and video streams. It further includes the third parameters from the combining operation, such as reflective, diffuse and specular values, bump maps, blooming, and scattering filters.

Typically, any reflected pictures and light sources move together within the environment according to some motion path. The simulated print and viewing angle and distance within the simulated environment may remain stationary while light sources or reflected pictures move relatively, or the simulated print may move, change angle, rotate or bend to simulate a user holding and viewing the physical printout, or some combination of the two.

For controlling the animation, there are also many possibilities.

The animation can be pre-defined, according to the design of an artist. Any or all of the motion paths of lights, reflection environments, blooming, changes of angle, glossy reflections and edge glints may be selected by artists to highlight the important details of the print preview. In this case, the animation plays to the user like an unchangeable movie, without allowing for much or any user control of that animation.

The animation can be computed according to various parameters, such as the shape of the artwork or document content such as the location of added text, the location of graphics or the objects in the environment, the location of high frequency areas, contrast variations within the document, or the like. In this case, the animation plays to the user like a movie that is customised for each document they preview.

The animation can be controlled by an input device such as a mouse or keyboard. In this case, the user may interactively control the angle of the simulated print with respect to its environment, or may control other aspects such as the motion, intensity, hue or number of light sources.

The animation can also be controlled by an accelerometer or gravity sensor, as can be found in some mobile devices. In this case, the user may control the angle of the simulated print with respect to its environment by physically tilting or moving the mobile device. A particularly pleasing synergy is formed if the environment data comes from a video camera connected to the screen of the mobile device. In that case, the print preview simulation can become very realistic as physical objects within the user's viewing environment are reflected within the reflective regions in the print preview.

The animation can also be controlled by a video camera attached to the screen, which uses object tracking to detect the position of the user's head or eye direction, and changes the simulated angles accordingly. This may be more appropriate than using accelerometers or gravity sensors for devices which are not mobile.

In combination with any of these controlling factors, the animation can be modified by random elements to avoid repetitiveness, or to simulate hand held jitters. Also, the animation can have enforced periods of stillness or low movement, so as not to disorient the user or distract them from viewing the regions of the print preview which do not involve spot colours.

Regardless of the techniques employed, the end result of this fourth step is an animated print preview, with elements of the simulated environment being reflected in at least the regions which are to be printed with reflective substances.

Printing Using Spot Colours

The purpose of this final step is to print the document as generated by the first step, using special spot colour substances to print the reflective regions. The output of the second, third and fourth steps, being the environment, the simulated reflection, and the animated simulation, are not considered here, because the printer is capable of printing the spot colour regions with reflective substances, and so simulations are not required. In particular, no blooming, bumpiness, simulated gloss, reflected details, or light effects need be transmitted to the printer. Instead, the spot colours regions are denoted to the printer such that the printer uses on those regions the appropriate corresponding spot colour substance.

Such spot colour substances are typically be special inks, dyes, toners, paints, films, lacquers or other substances with reflective properties. They may be partially translucent or transparent, have a metallic sheen, include glittery components, or otherwise produce a reflective or glinting effect under illumination, such that this example provides an appropriate print previewing mechanism. Traditional printing substances may be used to print some regions of the printout, which may overlap with, be combined with, or be distinct from, the spot colour regions. For example, a golden reflective appearance may be the result of mixing a traditional CMYK process yellow substance with a reflective lacquer spot colour. Another example is that the yellow substance is printed first and a translucent but glossy ink is applied over the top. Another example is that a golden dye is printed as a spot colour and no CMYK process is used where that dye is applied since the dye requires no coloured substrate to appear golden.

Communication between the printing device and the device used to preview the printout (if they are different devices) may be necessary to convey and control such activities as loading the correct spot colour substances at the correct times to correctly create a printout, or to restrict or control what print preview animations or spot colours may be selected or seen by the user.

As part of the printing process, a user interface will typically be provided to the user to initiate or control printing parameters. Similar animation techniques as used in previewing the printout may be used to display and animate the user interface buttons, text or other visible control elements, if desired, to make these elements also appear to be reflective, to provide visual consistency, or just because that looks cool.

Animated Previews of Angle-Variant Substances

The techniques described above can also be used to preview inks, dyes, toners, paints, films, lacquers or printing substances which vary in colour based on the incident viewing angle.

Figure 15:
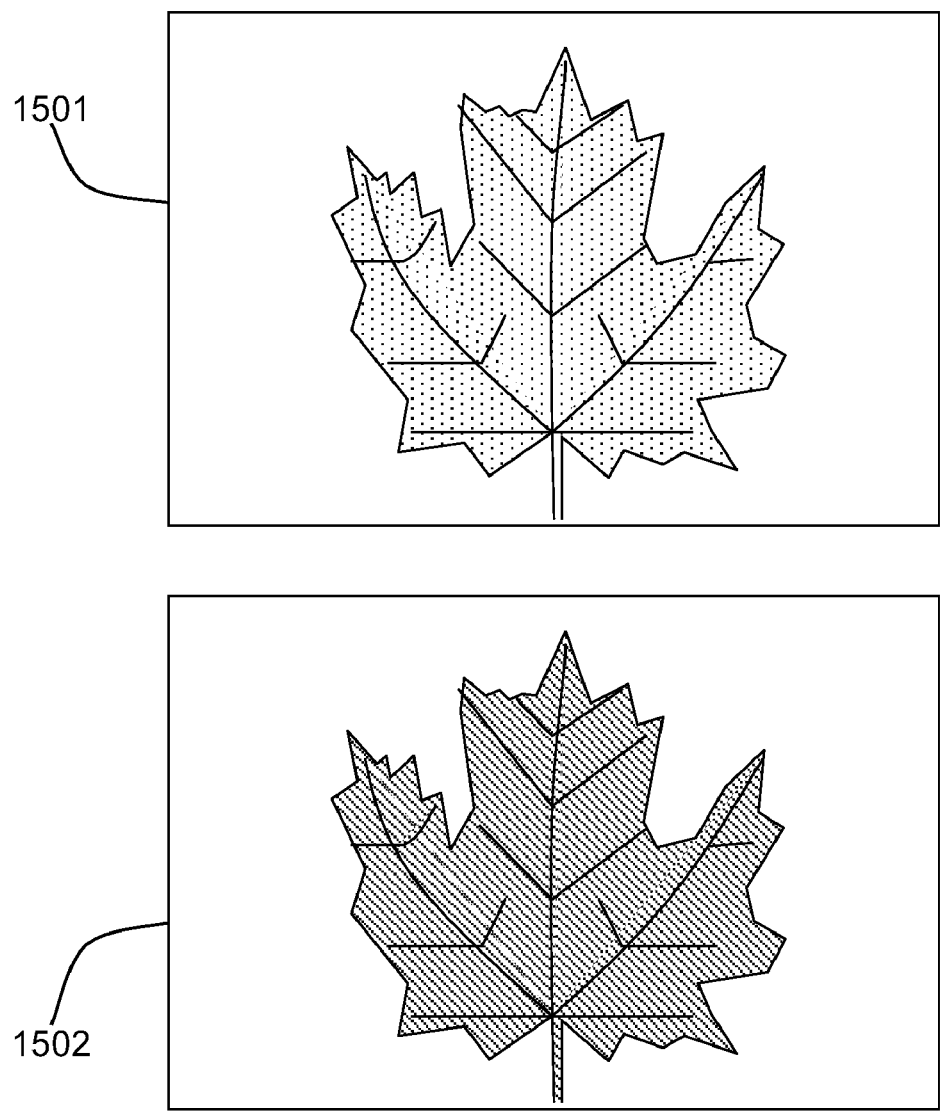
FIG. 15 is a schematic diagram of an example of an animated print representation showing a viewing angle dependent colour region; and, FIG. 16 is a schematic diagram of an example of an animated print representation showing a region visible under certain illumination wavelengths.

An example of this will now be described with respect to FIG. 15, which shows a printed picture using inks that highlight red colours when viewed from one angle 1501 but highlight greens and blues from another angle 1502, simulating the change in foliage colouration from autumn to summer.

This may be processed in a manner similar to the previous example, but without the need to simulate reflections as part of the environmental conditions. Accordingly, the environment determined in this example need not incorporate detailed objects, the mathematics of reflection may not need to be applied to the document, and reflective substances are not used when printing.

Despite these differences, similar techniques may be used, with the colour presented to the user in the print representation being animated to simulate colour variation as the printout is moved.

To achieve this, angles may be simulated and controlled using user input devices such as a mouse, camera or by motion of a mobile device, or animated according to patterns determined by computation or pre-defined by artists or other designers.

It can be seen that animation and three dimensional techniques allow print previews to simulate printing substances which have unusual properties, by associating time, changing angles, changing distances, changing pixel values, and user input, with these unusual properties.

Such printing substances which can vary in a numerically linear way (such as viewing angle) can be previewed prior to printing using animation (which uses time as an extra dimension) and three dimensional techniques (which simulated third dimension allows viewing and lighting angles and distances to be simulated) in ways not possible in the techniques of the prior art.

It will therefore be appreciated that these techniques may be applied to other substances which change colour or translucency by temperature, by viewing under certain wavelengths of light, by the application of electrical current, by the presence of chemicals, by physical distortions of the substance or the media it adheres to, including warping or shearing. Indeed, the mix of printing substances, or the selection of particular printing substances from a set, might vary with time during the animation, so as to facilitate user selection of which spot colour or mix of spot colours to use.

Animated Previews of Translucent Substances

The techniques can also be applied to preview inks, dyes, toners, paints, films, lacquers or printing substances which are used to apply a partially translucent or transparent film or lacquer onto parts of the printout. Collectively these spot colour substances or finisher substances will be referred to as 'translucent' substances.

Although they may be transparent at some angles or human-visible wavelengths of light, they are not transparent at all such angles or wavelengths of light. During the printing step, such translucent substances may be printed in areas distinct from the other areas of the printout, or under-printed or over-printed on those areas. These substances may apply tints, shadowing effect, glossy reflections, or other such effects to any substances printed or visible beneath them. These substances may even have special properties in other wavelengths of light, for example, they may fluoresce under UV light.

Figure 16:
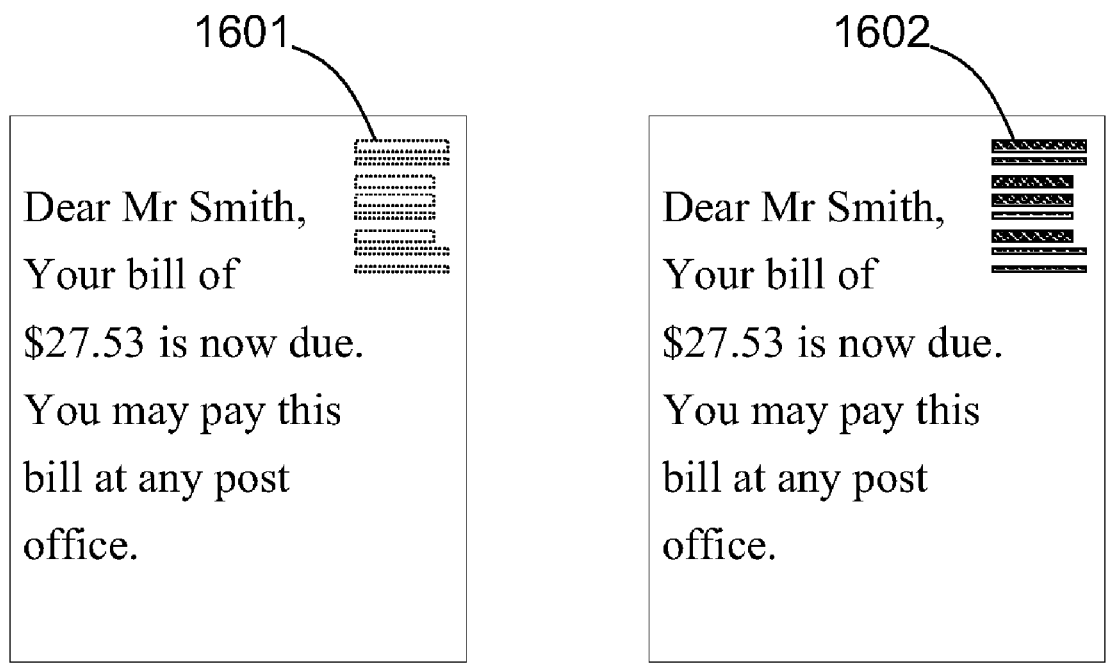

In FIG. 16 an example of a barcode which is only visible under laser light is shown. The barcode is printed with a translucent (but not invisible) ink 1601 so an operator can see where it is, but it does not distract the reader, but when a laser scanner passes laser light over the barcode the ink becomes opaque 1602 and the laser scanner can read it.

In this example, such translucent substances cannot be easily previewed using traditional static print preview methods, so an animated print preview is used to inform the user of the location (and possibly to indicate the material properties) of those spot colour regions.

As in the example of reflective substances, if the translucent substance has a reflective or glossy property, an environment is required to allow the simulation of reflections during the combining and animating steps. Alternatively, if the substance substantially reflects lights but not details of its surrounds, it may be sufficient for the environment defined in step two to only contain light sources rather than any detailed picture elements.

Animated Preview of Glossy or Reflective Media or Inks

In this example, the techniques are used to preview glossiness or reflective properties of media or printing substances that are not spot colours. For example, many traditional printing media and substances like ink and toner have a natural glossiness or some reflective properties.

This example uses the same kind of animation described in the reflective examples to simulate these reflective properties within a print preview.

Where used in combination with reflective or translucent spot colour substances, the differences between the reflective properties of the spot colour substances and the traditional printing substances or media can be highlighted and displayed using animation. For example, different reflections might appear within a silver metallic substance and the glossy media it is printed on. Or the same reflections might appear but with different specular highlighting or different scattering or diffusion, so that each reflection varies and the boundaries between printing substances and media can be distinguished.

Animated Preview of Ordinarily Displayable Printing Substances

In this example, the technique is used to preview prints that have coloured regions that are process colours or spot colours that are displayable using the display's normal gamut. The printing substances used may be traditional process colours or toners such as from a CMYK process, or they may be spot colours, or some combination of these.

This example allows, for example, a set or range of colours, or intended printing substances, or a region to be chosen by the user, by an artist, or by an algorithm (or all three), with the set, range or region being previewed using animation techniques as described above.

Consequently different lighting conditions and angles, viewing conditions, printing substance properties, edge boundaries and print properties may be previewed by the user in a manner which imparts information about the printout or the print process in a more interactive or informative manner. For example, it may be possible for the user to interactively simulate the folding of paper and observe the (simulated) effects of lighting angles on the printout, and of the appearance of the toner at a fold in the medium (it might crack or whiten for example).

Likewise, ordinary inks may have different light scattering properties at different angles, so that viewing a printed page with light shining on it at a low angle may introduce shininess in the inks which may not be ordinarily visible if the printout is viewed from a more normal lighting angle, and these variations in the appearances of printing substances may be measured as above, and displayed using animated or interactively varying print previews.

Where spot colours are used, animating those regions by replacing them with time-varying imagery can be used to inform the user of which printing substances will be used and where. For example, a spot colour could be selected, and regions that use that spot colour may be replaced in a (otherwise static) print preview by animated imagery. This alerts the user as to the location and possibly even the quantity required of that particular spot colour. Later, a different spot colour may be selected. Even multiple spot colours may be selected, and each is replaced by either similar or decidedly different animations.

It will be appreciated that the above described examples may be combined in various ways.

Thus, for example, it is possible to provide an animated interactive preview that allows the user to manipulate simulated prints within a simulated three dimensional environment, including turning pages in ways consistent with folds, bindings or staples, to simulate the reflectivity of translucent covers, spot colour substances, ordinary printing substances, media and other binding materials, and even to interactively modify the document to be printed (perhaps by direct manipulation) by editing portions of it or by varying its binding properties within this mode.

In any event, the above described process allows print previews to be provided that reflect viewing conditions for the resulting printout, thereby simulating properties of spot colour substances which cannot be otherwise simulated.

It will be appreciated by those skilled in the art that the methods and systems described can be used on documents other than images or photos.

The term processing system is understood to encompass the computer system 200, as well as any other suitable processing system, such as a set-top box, PDA, mobile phone, or the like.

The foregoing describes only some embodiments of the present invention, and modifications and/or changes can be made thereto without departing from the scope and spirit of the invention, the embodiments being illustrative and not restrictive.

In the context of this specification, the word "comprising" means "including principally but not necessarily solely" or "having" or "including", and not "consisting only of". Variations of the word "comprising", such as "comprise" and "comprises" have correspondingly varied meanings.

What is claimed is:

1. The method of providing a print preview representation of a document which, when printed, has at least one region the appearance of which is dependent on viewing conditions under which the printed document is viewed, the method comprising, in a processing system:
    a) generating a print preview representation of the document, said print preview representation being associated with the viewing conditions; and
    b) animating the appearance of the at least one region in the print preview representation by applying a scattering filter to thereby simulate a change in the appearance of the printed document in accordance with a change in the viewing conditions.

2. The method according to claim 1, wherein the at least one region is to be printed using a spot color.

3. The method according to claim 2, wherein the spot color is formed from at least one of inks, dyes, toners, paints, films, lacquers and other printing substances having a reflective metallic appearance.

4. The method according to claim 1, wherein the method further comprises, in the processing system, animating the representation of the at least one region by moving the image.

5. The method according to claim 1, wherein the method further comprises, in the processing system, animating the representation in accordance with at least one of:
    a) a cursor position;
    b) input commands from a user;
    c) movement of the user detected using a sensing system; and,
    d) signals from a motion sensing device.

6. The method according to claim 1, further comprising at least partially combining the at least one region with an image, wherein the image is at least one of:
    a) indicative of a light source effect;
    b) a time varying image;
    c) captured using a camera system;
    d) a simulation of a three dimensional environment including a number of objects; and,
    e) indicative of a reflection.

7. The method according to claim 1, wherein the method further comprises, in the processing system:
    a) determining first parameters relating to the document; and,
    b) modifying the appearance of the region in accordance with the determined first parameters.

8. The method according to claim 7, wherein the method further comprises, in the processing system, determining the first parameters using at least one of:
    a) the document content; and,
    b) the differences between the at least one region and other regions of the document.

9. The method according to claim 1, wherein the method further comprises, in the processing system:
    a) determining second parameters relating to the image; and,
    b) modifying the appearance of the region in accordance with the determined second parameters.

10. The method according to claim 9, wherein the method further comprises, in the processing system, determining the second parameters based on at least one of:
    a) objects within the image; and,
    b) at least one light source.

11. The method according to claim 1, wherein the method further comprises, in the processing system:
    a) determining parameters relating to the combination of the image and the region; and,
    b) modifying the appearance of the region in accordance with the determined parameters.

12. The method according to claim 11, wherein the method further comprises, in the processing system, determining the parameters based on at least one of:
    a) reflectivity;
    b) diffusivity;
    c) specular values; and
    d) blooming.

13. The method according to claim 1, wherein the method further comprises, in the processing system, at least partially combining the at least one region with an image and animating the image by varying at least one of:
    a) first parameters relating to the document; and,
    b) second parameters relating to the image; and,
    c) third parameters relating to the combination of the image and the region.

14. The method according to claim 1, wherein the method further comprises, in the processing system, at least partially combining the at least one region with an image and modifying the appearance of the at least one region by applying at least one of bumpiness, height variations, shading, warping and folding to at least part of a surface upon which the image is rendered to thereby simulate at least one of grain, texture, shininess, reflection, embossing, diffusion, scattering, and specular reflection.

15. The method according to claim 1, wherein the method further comprises, in the processing system, modifying regions other than the at least one region by at least one of blooming and bleeding of a bright portion of the at least one region into the other regions.

16. The method according to claim 1, wherein the at least one region is to be printed using at least one of:
    a) a reflective substance;
    b) a substance having a metallic appearance;
    c) a substance that is at least partially translucent;
    d) a substance whose appearance is dependent on the viewing angle; and,
    e) a temperature sensitive substance.

17. The method according to claim 1, wherein the viewing condition is at least one of:
    a) the viewing incidence angle;
    b) the viewing distance;
    c) the viewing orientation;
    d) a temperature;
    e) a time;
    f) the position of the at least one region upon the printed document ;
    g) the size of the spot color region,
    h) the shape of a print medium;
    i) the distortion of a print medium;
    j) the proximity to other substances;
    k) the proximity to light sources;
    l) the application of electrical currents; and
    m) the wavelengths of illuminating light.

18. The method according to claim 1, wherein the document is formed from an image and a template, the template defining the at least one region.

19. The method according to claim 1, wherein the method further comprises, in the processing system:
   a) causing the print representation to be displayed to the user; and,
   b) causing the document to be printed in accordance with input commands from the user.

20. The method according to claim 1, wherein the method further comprises, in the processing system, determining the at least one region in accordance with at least one of:
   a) the document content; and,
   b) user input commands.

21. An apparatus for providing a print preview representation of a document which, when printed, has at least one region the appearance of which is dependent on viewing conditions under which the printed document is viewed, the apparatus comprising a processing system configured to:
   a) generate a print preview representation of the document, said print preview representation being associated with the viewing conditions; and
   b) animate the appearance of the at least one region in the print preview representation by applying a scattering filter to thereby simulate the appearance of the printed document in accordance with a change in the viewing conditions.

22. A non-transitory computer-readable medium for use in providing a print preview representation, the computer-readable medium comprising executable code which when executed on a suitable processing system causes the processing system to:
   a) generate a print preview representation of the document, said print preview representation being associated with the viewing conditions; and
   b) animate the appearance of the at least one region in the print preview representation by applying a scattering filter to thereby simulate a change in the appearance of the printed document in accordance with a change in the viewing conditions.

23. The method according to claim 1, wherein the scattering filter uses a map indicative of a profile simulating a document surface for the at least one region to thereby simulate the appearance of the document when printed.

24. The method according to claim 23, wherein the map includes a height map representing the profile of the at least one region, wherein the height map includes a plurality of points which represent a corresponding plurality of points of the document surface.

25. The method according to claim 24, wherein the method further includes:
   calculating a vector normal for each point of the map; and
   for each pixel of the at least one region, using the respective vector at the corresponding point to determine a source pixel to color the respective pixel.

26. The method according to claim 24, wherein the method further includes:
   generating a normal map from the height map, wherein the normal map is indicative of a normal at each point represented by the height map;
   combining each normal of the normal map with an intended viewpoint to generate an offset vector; and
   for each pixel in the at least one region, using the offset vector to determine a source pixel to color the respective pixel.

27. The method according to claim 1, wherein the method further includes modifying the appearance of one or more neighbouring regions of the document relative to the at least one region by applying a blooming filter.

28. The method according to claim 27, wherein applying the blooming filter results in at least one of a flare and a halo being applied at the one or more neighbouring regions.

* * * * *